United States Patent
Ikuta

(10) Patent No.: US 9,268,207 B2
(45) Date of Patent: Feb. 23, 2016

(54) REFLECTIVE MASK BLANK FOR EUV LITHOGRAPHY, METHOD OF MANUFACTURING THEREOF, REFLECTIVE MASK FOR EUV LITHOGRAPHY AND METHOD OF MANUFACTURING THEREOF

(71) Applicant: Asahi Glass Company, Limited, Tokyo (JP)

(72) Inventor: Yoshiaki Ikuta, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 14/669,996

(22) Filed: Mar. 26, 2015

(65) Prior Publication Data

US 2015/0198874 A1 Jul. 16, 2015

Related U.S. Application Data

(63) Continuation of application No. PCT/JP2013/075915, filed on Sep. 25, 2013.

(30) Foreign Application Priority Data

Sep. 28, 2012 (JP) .................. 2012-218129
Jul. 5, 2013 (JP) .................. 2013-141375

(51) Int. Cl.
- G03F 1/24 (2012.01)
- G03F 1/22 (2012.01)
- G03F 1/38 (2012.01)
- G03F 1/72 (2012.01)
- G03F 1/78 (2012.01)

(52) U.S. Cl.
CPC .. G03F 1/24 (2013.01); G03F 1/22 (2013.01); G03F 1/38 (2013.01); G03F 1/72 (2013.01); G03F 1/78 (2013.01)

(58) Field of Classification Search
CPC ............... G03F 1/22; G03F 1/24; G03F 1/38; G03F 1/72; G03F 1/78
USPC ........................................................ 430/5
See application file for complete search history.

(56) References Cited

U.S. PATENT DOCUMENTS

| 7,660,456 B2 | 2/2010 | Ishida et al. |
| 7,678,511 B2 | 3/2010 | Ikuta et al. |
| 7,960,077 B2 | 6/2011 | Ikuta et al. |
| 8,241,821 B2 | 8/2012 | Ikuta |
| 8,916,316 B2 | 12/2014 | Okamura et al. |
| 8,921,017 B2 | 12/2014 | Okamura et al. |
| 2010/0178597 A1 | 7/2010 | Ishida et al. |
| 2010/0237256 A1 | 9/2010 | Yoshitake |
| 2011/0217634 A1 | 9/2011 | Shoki |
| 2012/0019916 A1 | 1/2012 | Shoki |
| 2014/0302429 A1 | 10/2014 | Shoki et al. |

FOREIGN PATENT DOCUMENTS

| JP | 11-176728 | 7/1999 |
| JP | 3412898 | 3/2003 |
| JP | 2006-047564 | 2/2006 |
| JP | 2010-79112 | 4/2010 |
| JP | 2010-219445 | 9/2010 |
| WO | WO 2008/129914 A1 | 10/2008 |
| WO | WO 2010/110237 A1 | 9/2010 |
| WO | WO 2012/121159 A1 | 9/2012 |
| WO | WO 2013/031863 A1 | 3/2013 |
| WO | WO 2013/118716 A1 | 8/2013 |
| WO | WO 2013/146488 A1 | 10/2013 |

OTHER PUBLICATIONS

International Search Report issued in International Application No. PCT/JP2013/075915, dated Nov. 12, 2013.
S. Huh et al.; International Symposium on Extreme Ultraviolet Lithography, "Printability and Inspectability of Programmed and Real Defects on the Reticle in EUV Lithography"; 2010.
P. Seidel and P. Y. Yan; EUVL mask fiducial Semi Standard Discussion, Jan. 2006.

*Primary Examiner* — Christopher Young

(74) *Attorney, Agent, or Firm* — Oblon, McClelland, Maier & Neustadt, L.L.P.

(57) ABSTRACT

A method of manufacturing a reflective mask blank for EUV lithography with a resist film, includes preparing a reflective mask blank provided with three or more concave or convex fiducial marks each formed by at least two lines placed to extend along any one of virtual lines that cross at an intersection point, at least one of the lines of the fiducial mark being placed to extend along each of the virtual lines; forming a resist film on the reflective mask blank; detecting fiducial positions corresponding to the intersection points of the fiducial marks by scanning with an electron beam or an ultraviolet light; and exposing specific areas of the resist film including circular areas centered at the fiducial positions of the respective fiducial marks with a radius of 1.5W, where W is the maximum value of a width of the line of the respective fiducial marks.

20 Claims, 17 Drawing Sheets

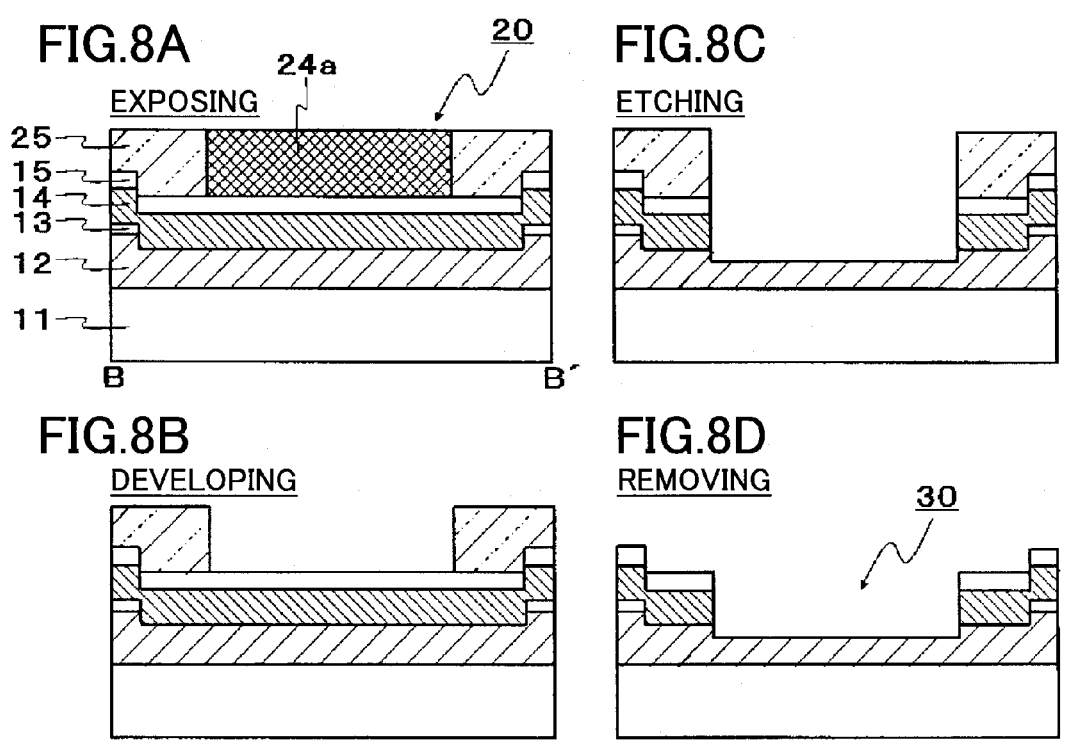

FIG.9A EXPOSING
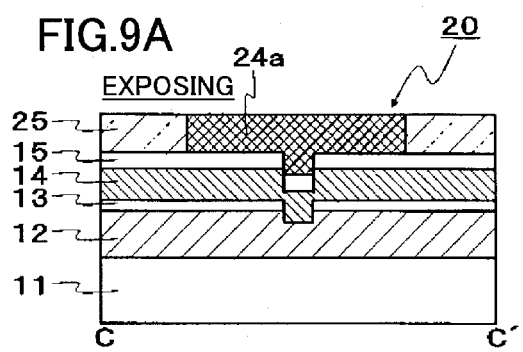
FIG.9C ETCHING
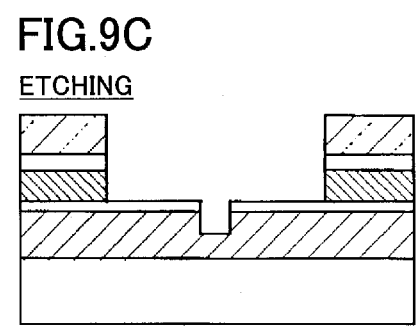
FIG.9B DEVELOPING
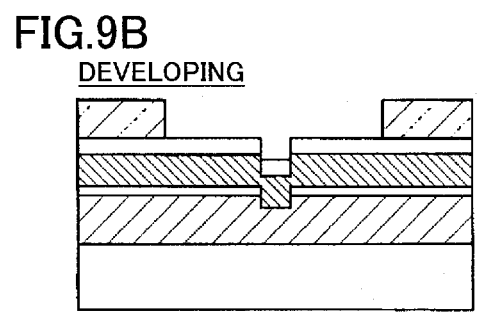
FIG.9D REMOVING
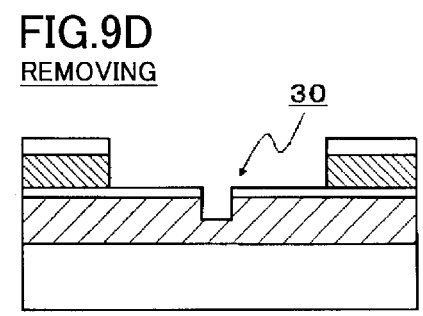

EXPOSING

ETCHING

DEVELOPING

REMOVING

FIG.13A EXPOSING
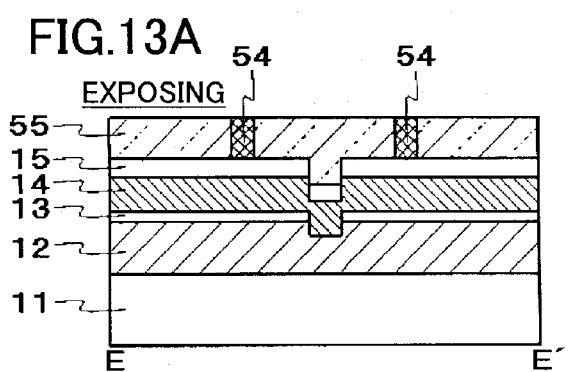
FIG.13B DEVELOPING
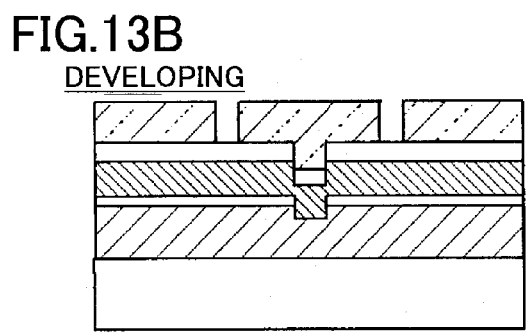
FIG.13C ETCHING
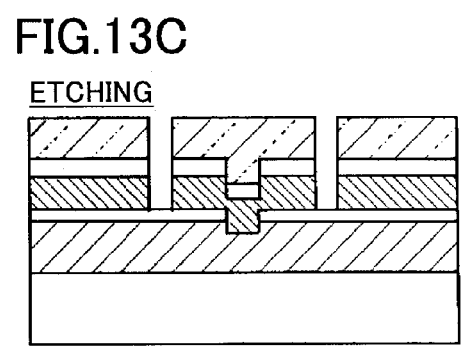
FIG.13D REMOVING
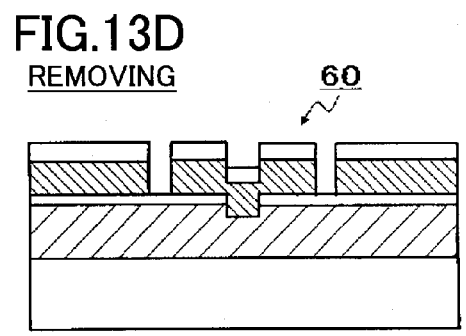

FIG.14A EXPOSING
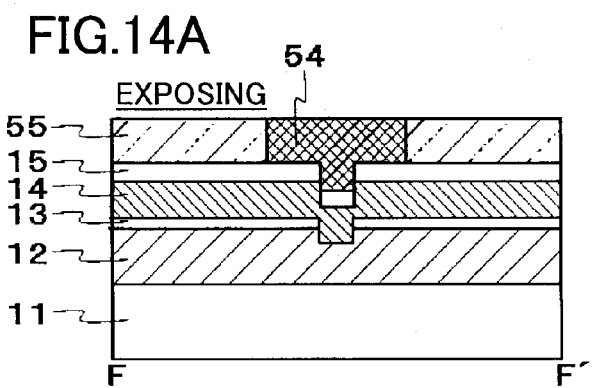
FIG.14B DEVELOPING
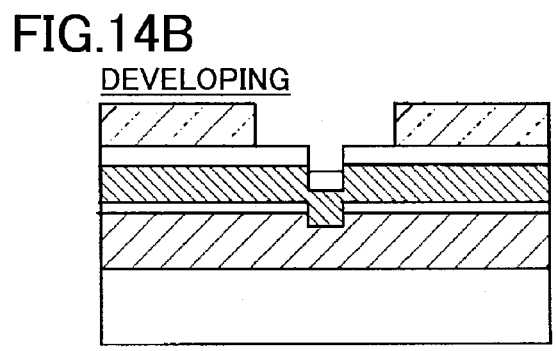
FIG.14C ETCHING
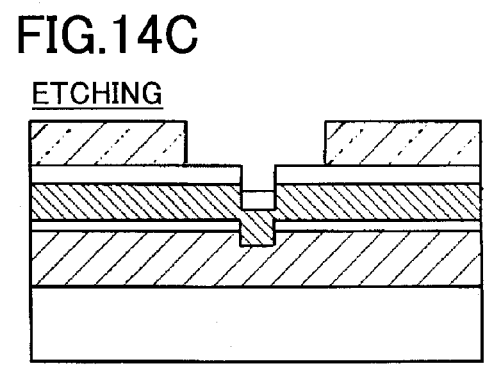
FIG.14D REMOVING
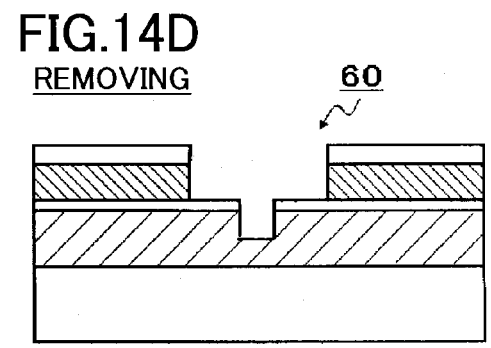

REFLECTIVE MASK BLANK FOR EUV LITHOGRAPHY, METHOD OF MANUFACTURING THEREOF, REFLECTIVE MASK FOR EUV LITHOGRAPHY AND METHOD OF MANUFACTURING THEREOF

CROSS-REFERENCE TO RELATED APPLICATION

This application is a continuation application filed under 35 U.S.C. 111(a) claiming the benefit under 35 U.S.C. 120 and 365(c) of PCT International Application No. PCT/JP2013/075915 filed on Sep. 25, 2013, which is based upon and claims the benefit of priority of Japanese Priority Application No. 2012-218129 filed on Sep. 28, 2012 and Japanese. Priority Application No. 2013-141375 filed on Jul. 5, 2013 and the entire contents of which are hereby incorporated by reference.

BACKGROUND OF THE INVENTION

1. Field of the Invention

The present invention relates to a reflective mask blank for EUV lithography, a method of manufacturing thereof, a reflective mask for EUV lithography and a method of manufacturing thereof.

2. Description of the Related Art

For an exposure system, the limit of resolution is determined in accordance with a wavelength of light that is irradiated on a semiconductor substrate or the like such as a Si substrate. Then, in such an exposure system, an exposure technique of a transmission optical system using KrF excimer laser whose wavelength is 248 nm, ArF excimer laser whose wavelength is 193 nm or the like is actualized. In such an exposure system, a transmission type mask is used in which a predetermined pattern is formed by a portion that transmits irradiated light and a portion that absorbs the irradiated light, and the predetermined pattern is transferred to a semiconductor substrate or the like by the transmission type mask.

Meanwhile, as an exposure technique using light whose wavelength is shorter than that of the ArF excimer laser, in order to actualize further high resolution of a pattern to be transferred to the semiconductor substrate or the like, an exposure technique using EUV (Extreme Ultra-Violet) light is paid attention. The EUV light means light having a wavelength in a soft X-ray region or in a vacuum ultraviolet region, and specifically, the EUV light means light with a wavelength of about 10 nm to 20 nm, in particular, about 13.2 nm to 13.8 nm (13.5 nm±0.3 nm).

Due to the characteristics of the EUV light, the transmission optical exposure system using a KrF excimer laser light source, an ArF excimer laser light source or the like cannot be adapted to the exposure technique using the EUV light, and thus, a reflective optical exposure system is adapted. Then, in such a reflective optical exposure system, a reflective mask for EUV lithography or a reflective mirror for EUV is used. Here, in this specification, the reflective mask for EUV lithography is referred to as an "EUV mask" as well.

A reflective mask blank for EUV lithography is a patterned precursor of the EUV mask and includes a layer that reflects the EUV light. Here, in this specification, the reflective mask blank for EUV lithography is referred to as an "EUV mask blank" as well. Specifically, the EUV mask blank includes at least a reflective layer that reflects the EUV light on a flat substrate such as glass or the like, and an absorber layer that absorbs the EUV light on the reflective layer. Further, the EUV mask has a structure in which a predetermined pattern is formed at the absorber layer of the EUV mask blank, and is capable of transferring the predetermined pattern to a semiconductor substrate or the like by absorbing the irradiated EUV light at a portion where the absorber layer exists and reflecting the irradiated EUV light at a portion where the absorber layer does not exist.

Generally, a multilayer reflective film is used for the reflective layer in which a high reflective layer having high refractive index to the EUV light and a low reflective layer having low refractive index to the EUV light are alternately stacked. For the multilayer reflective film, for example, a Mo/Si multilayer reflective film including a silicon (Si) layer as a high reflective layer and a molybdenum (Mo) layer as a low reflective layer may be used, and reflectance of the EUV light greater than or equal to 60% can be actualized. Further, for the absorber layer, a material having low reflectance of the EUV light, in other words, a material having a high absorption coefficient of the EUV light is used; for example, a material containing Ta or Cr as a main component may be used.

Here, if defects (contaminant, flaw or pit, for example) exist at a surface of the substrate such as glass or the like, or contaminant is mixed while forming the multilayer reflective film, a periodic structure of the multilayer reflective film is disturbed and defects (a so-called phase defect) are generated in the multilayer reflective film. When such defects are generated, a problem may occur that a pattern on the EUV mask is not correctly transferred to a semiconductor wafer. However, actually, it is technically extremely difficult to eliminate all of the defects of the multilayer reflective film (see non-Patent Document 1, for example).

Thus, a technique has been studied in which positions of the defects in the EUV mask blank are detected, and when manufacturing an EUV mask, a position or direction of the pattern of the absorber layer is adjusted to avoid these defects. Specifically, it is described that a fiducial mark is formed at the reflective layer of the EUV mask blank (see non-Patent Document 2, for example).

Further, the fiducial mark is formed in a concave form or a convex form at an outside area from an actual mask pattern area (an area of 132 mm×132 mm, for example), on the multilayer reflective film, on the substrate or on the absorber layer. Here, for the fiducial mark, typically, a cruciform mark in a plan view is used, and a position of intersection point of the cross of the fiducial mark is often assumed as a fiducial position. Then, information for specifying positions (coordinates) of defects that exist in the actual mask pattern area is obtained based on the fiducial position. Here, coordinates of a plane can be specified when there are at least three fiducial marks at the outside area from the mask pattern area, and the fiducial marks are provided at positions such that intersection points of the crosses of the fiducial marks are not on the same virtual line. Typically, the cruciform fiducial marks are often formed at three corners or four corners outside of the mask pattern area.

FIG. 16 is a plan view schematically illustrating an EUV mask blank 100 with fiducial marks in which fiducial marks 101, 102, 103 and 104 are provided at four corners of an area outside a mask pattern area 105. Then, for the position of each of the fiducial marks, an intersection point of the cross, which is a fiducial position, can be accurately specified by scanning with an electron beam or an ultraviolet light in the vicinity of the fiducial mark with a predetermined space and detecting the difference between reflection intensities, or scattered light intensity generated by concave and convex parts of the fiducial marks. Here, the ultraviolet light in this specification means light with a wavelength range of 170 nm to 400 nm.

As such, as the fiducial mark is the fiducial position for accurately detecting the coordinates of the position of a defect in the EUV mask blank, it is important to specify the fiducial position with high accuracy in an apparatus that is used in manufacturing the EUV mask blank and the EUV mask (in an inspection step, for example). Further, for a method of detecting the fiducial mark, a method or the like is reported in which the fiducial mark is detected even after a resist film is formed on the EUV mask blank by scanning with an electron beam in the vicinity of the fiducial mark from an upper side of the resist film in the step of manufacturing the EUV mask (see Patent Document 1, for example).

Patent Document

[Patent Document 1] WO 2010/110237

Non-Patent Documents

[Non-Patent Document 1] 2010 International Symposium on Extreme Ultraviolet Lithography, S. Huh et al., "Printability and Inspectability of Programmed and Real Defects on the Reticle in EUV Lithography"

[Non-Patent Document 2] EUVL mask fiducial SEMI Standard Discussion January 2006, P. Seidel and P. Y. Yan

SUMMARY OF THE INVENTION

The present invention is made in light of the problems which is explained below, and provides a reflective mask blank for EUV lithography with a resist film, a method of manufacturing thereof, a reflective mask for EUV lithography and a method of manufacturing thereof capable of increasing detection sensitivity of a fiducial mark that indicates a fiducial position for specifying a position of a defect existing in a mask pattern area in inspecting a mask pattern of the reflective mask for EUV lithography.

According to an embodiment, there is provided a method of manufacturing a reflective mask blank for EUV lithography with a resist film, including: preparing a reflective mask blank for EUV lithography including a substrate, a reflective layer that reflects an EUV light on the substrate, and an absorber layer that absorbs the EUV light on the reflective layer, the reflective mask blank for EUV lithography being provided with three or more concave or convex fiducial marks being formed at an outside area from a mask pattern area of the reflective mask blank for EUV lithography, each of the fiducial marks being formed by at least two lines in a plan view, each of the lines that form the fiducial mark being placed to extend along any one of a plurality of virtual lines that cross at an intersection point, and at least one of the lines of the fiducial mark being placed to extend along each of the virtual lines; forming a resist film on the reflective mask blank for EUV lithography including the fiducial marks; detecting fiducial positions corresponding to the intersection points of the fiducial marks by scanning the resist film with an electron beam or an ultraviolet light above the resist film; and exposing specific areas of the resist film including circular areas centered at the fiducial positions of the respective fiducial marks with a radius of 1.5W in a plan view, where W is the maximum value of a width of the line of the respective fiducial marks, by using the electron beam or the ultraviolet light.

According to another embodiment, there is provided a method of manufacturing a reflective mask for EUV lithography, including: preparing a reflective mask blank for EUV lithography including a substrate, a reflective layer that reflects an EUV light on the substrate, and an absorber layer that absorbs the EUV light on the reflective layer, the reflective mask blank for EUV lithography being provided with three or more concave or convex fiducial marks being formed at an outside area from a mask pattern area of the reflective mask blank for EUV lithography, each of the fiducial marks being formed by at least two lines in a plan view, each of the lines that form the fiducial mark being placed to extend along any one of a plurality of virtual lines that cross at an intersection point, and at least one of the lines of the fiducial mark being placed to extend along each of the virtual lines; forming a resist film on the reflective mask blank for EUV lithography including the fiducial marks; detecting fiducial positions corresponding to the intersection points of the fiducial marks by scanning the resist film with an electron beam or an ultraviolet light above the resist film; exposing specific areas of the resist film including circular areas centered at the fiducial positions of the respective fiducial marks with a radius of 1.5W in a plan view, where W is the maximum value of a width of the line of the respective fiducial marks, by using the electron beam or the ultraviolet light; developing the resist film; etching the absorber layer using the resist film as a mask; and removing the remaining resist film.

According to another embodiment, there is provided a reflective mask blank for EUV lithography with a resist film, including: a reflective mask blank for EUV lithography including a substrate, a reflective layer that reflects an EUV light on the substrate, and an absorber layer that absorbs the EUV light on the reflective layer, the reflective mask blank for EUV lithography being provided with three or more concave or convex fiducial marks, for specifying position of a defect in a mask pattern area, being formed at an outside area from a mask pattern area of the reflective mask blank for EUV lithography, each of the fiducial marks being formed by at least two lines in a plan view, each of the lines that form each of the fiducial marks being placed to extend along either of a plurality of virtual lines that cross at an intersection point, and at least one of the lines of the fiducial mark being placed to extend along each of the virtual lines; and a resist film on the reflective mask blank for EUV lithography provided with exposed portions that are specific areas including circular areas centered at the fiducial positions of the respective fiducial marks with a radius of 1.5W in a plan view, where W is the maximum value of a width of the line of the respective fiducial marks.

According to another embodiment, there is provided a reflective mask for EUV lithography, including: a substrate; a reflective layer that reflects an EUV light on the substrate; an absorber layer that absorbs the EUV light on the reflective layer; and a protection layer between the reflective layer and the absorber layer that protects the reflective layer when forming a pattern to the absorber layer, the reflective mask for EUV lithography being provided with three or more concave or convex fiducial marks, for specifying position of a defect in a mask pattern area, being formed at an outside area from a mask pattern area of the reflective mask blank for EUV lithography, each of the fiducial marks being formed by at least two lines in a plan view, each of the lines that form each of the fiducial marks being placed to extend along either of a plurality of virtual lines that cross at an intersection point, and at least one of the lines of the fiducial mark being placed to extend along each of the virtual lines, and within circular areas centered at the fiducial positions of the respective fiducial marks with a radius of 1.5W in a plan view, where W is the maximum value of a width of the line of the respective fiducial marks, the reflective layer being exposed at a surface at concave shapes that correspond to the fiducial marks and the protection layer being exposed at a surface other than the fiducial marks.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 8A is a cross-sectional view schematically illustrating an example of the fiducial mark portion after being exposed;

FIG. 8B is a cross-sectional view schematically illustrating an example of the fiducial mark portion after being developed;

FIG. 8C is a cross-sectional view schematically illustrating an example of the fiducial mark portion after being etched;

FIG. 8D is a cross-sectional view schematically illustrating an example of the fiducial mark portion after being removed;

FIG. 9A is a cross-sectional view schematically illustrating an example of the fiducial mark portion after being exposed;

FIG. 9B is a cross-sectional view schematically illustrating an example of the fiducial mark portion after being developed;

FIG. 9C is a cross-sectional view schematically illustrating an example of the fiducial mark portion after being etched;

FIG. 9D is a cross-sectional view schematically illustrating an example of the fiducial mark portion after being removed;

FIG. 13A is a cross-sectional view schematically illustrating the comparative example of the fiducial mark portion after being exposed;

FIG. 13B is a cross-sectional view schematically illustrating the comparative example of the fiducial mark portion after being developed;

FIG. 13C is a cross-sectional view schematically illustrating the comparative example of the fiducial mark portion after being etched;

FIG. 13D is a cross-sectional view schematically illustrating the comparative example of the fiducial mark portion after being removed;

FIG. 14A is a cross-sectional view schematically illustrating the comparative example of the fiducial mark portion after being exposed;

FIG. 14B is a cross-sectional view schematically illustrating the comparative example of the fiducial mark portion after being developed;

FIG. 14C is a cross-sectional view schematically illustrating the comparative example of the fiducial mark portion after being etched;

FIG. 14D is a cross-sectional view schematically illustrating the comparative example of the fiducial mark portion after being removed;

DETAILED DESCRIPTION OF THE PREFERRED EMBODIMENTS

Figure 1:
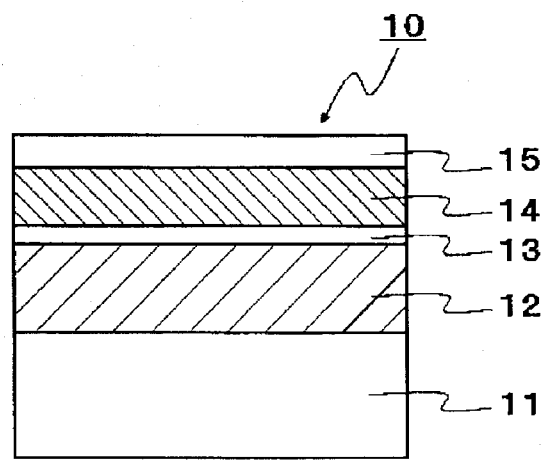
FIG. 1 is a cross-sectional view schematically illustrating an example of an EUV mask blank.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

As described above, as the fiducial mark is formed for a purpose of accurately specifying the defect position in the mask pattern area, the fiducial mark is required to have a high detection accuracy.

Figure 17A:
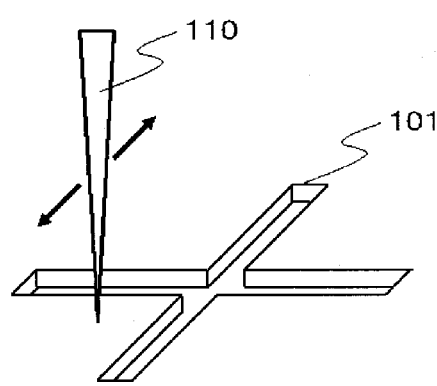
FIG. 17A is a schematic view illustrating an electron beam or an ultraviolet light scanning the fiducial mark.
Figure 17B:
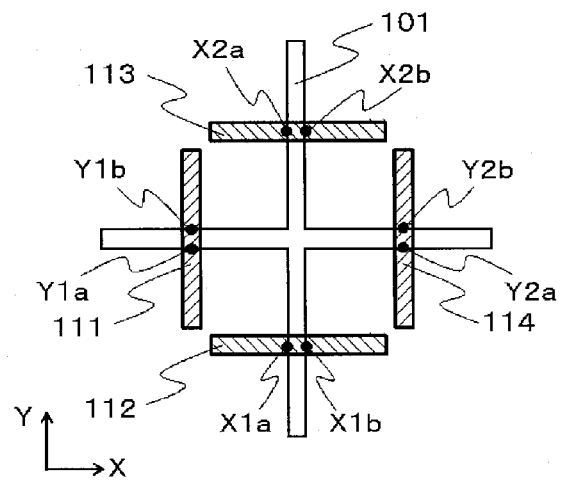
FIG. 17B is a plan view schematically illustrating scan traces of the fiducial mark.

FIG. 17A is a schematic view illustrating a process in which an electron beam or an ultraviolet light 110 performs scanning for detecting a position of a concave fiducial mark 101 and an intersection point of a cross. The position of the cruciform fiducial mark 101 is often detected by scanning the electron beam or the ultraviolet light 110 in directions that are substantially parallel to two axes that form the cruciform, and further, the electron beam or the ultraviolet light 110 is often used to scan within a predetermined space such that traces (hereinafter, referred to as a "scan trace") are discretely generated by the scan. FIG. 17B is a plan view schematically illustrating an example of the fiducial mark 101 and scan traces 111, 112, 113 and 114 generated by the electron beam or the ultraviolet light 110. Here, a step of detecting the fiducial marks includes a rough detection (rough scan) for detecting an existence of the fiducial mark, and a precise detection (precise scan) for detecting a fiducial point of the fiducial mark after the rough detection. Here, the "scan trace" may be either or both a trace formed by the rough scan and a trace formed by the precise scan.

The scan traces 112 and 113 are lines parallel to an X axis direction and cross a line of the fiducial mark 101 that is parallel to a Y axis direction. The two edges of the line, in its width direction, of the fiducial mark 101 that is parallel to the Y axis direction respectively overlap the scan trace 112 at intersection points X1a and X1b and the scan trace 113 at intersection points X2a and X2b.

Further, the scan traces 111 and 114 are lines parallel to the Y axis direction and cross a line of the fiducial mark 101 that is parallel to the X axis direction. The two edges of the line, in its width direction, of the fiducial mark 101 that is parallel to the X axis direction respectively overlap the scan trace 111 at intersection points Y1a and Y1b and the scan trace 114 at intersection points Y2a and Y2.

As such, the electron beam or the ultraviolet light 110 scans along the X axis direction while changing the position in the Y axis direction N times (N is an integer of two or more), and the electron beam or the ultraviolet light 110 scans along the Y axis direction while changing the position in the X axis direction M times (M is an integer of two or more). The positions of the edges of the lines, in their width directions, of the fiducial mark 101 are detected by the scans.

Here, when assuming the positions of the edges of the line, in its width direction, of the fiducial mark 101 that is parallel to the Y axis direction are Xia and Xib when the i-th scan ($1 \leq i \leq N$) along the X axis direction is performed, a center position Xic of the line of the fiducial mark 101 that is parallel to the Y axis direction in the i-th scan can be expressed as follows.

$$Xic = (Xia + Xib)/2 \quad (1)$$

Further, when assuming the positions of the edges of the line, in its width direction, of the fiducial mark 101 that is parallel to the X axis direction are Yja and Yjb when the j-th scan ($1 \leq j \leq M$) along the Y axis direction is performed, a center position Yjc of the line of the fiducial mark 101 that is parallel to the X axis direction in the j-th scan can be expressed as follows.

$$Yjc = (Yja + Yjb)/2 \quad (2)$$

Here, the average center position Xc of the lines that are parallel to the Y axis direction when scanned N times along the X axis direction and the average center position Yc of the lines that are parallel to the X axis direction when scanned M times along the Y axis direction are calculated by the following equations (3a) and (3b), respectively. Then, the coordinates (Xc, Yc) obtained here become a fiducial point (fiducial position) of the fiducial mark.

[Equation 1]

$$Xc = \sum_{i=1}^{N} \left(\frac{Xic}{N}\right) \quad (3a)$$

$$Yc = \sum_{j=1}^{M} \left(\frac{Yjc}{N}\right) \quad (3b)$$

As such, it is necessary to detect the fiducial mark 101 and the intersection point of the cross by the electron beam or the ultraviolet light 110 even for the EUV mask blank with a resist film in which the surface is covered with a chemical amplification type resist or the like. However, when the surface of the resist is scanned by the electron beam or the ultraviolet light 110, there is a possibility that irradiated portions, that is, portions of the (chemical amplification type) resist at the scan traces 111, 112, 113 and 114 in FIG. 17B will be exposed.

In such a case, when manufacturing an EUV mask by drawing a predetermined mask pattern in a mask pattern area of the EUV mask blank with a resist film by electron beam or the like, developing the (chemical amplification type) resist, etching the absorber layer, and removing the remaining resist, the structure in the vicinity of the fiducial mark 101 becomes complicated. For example, a step is generated between a portion of the fiducial mark 101 at which the fiducial mark 101 and the scan traces 111, 112, 113 and 114 are overlapped, and a portion of the fiducial mark 101 at which the fiducial mark 101 and the scan traces 111, 112, 113 and 114 are not overlapped. In such a case, there is a possibility that the detection sensitivity of the fiducial mark will be lowered due to the step generated by the scan traces, and accuracy of a mask pattern inspection is lowered when detecting the position of the fiducial mark or the intersection point of the cross formed on the EUV mask with an inspection device for inspecting (matching) the mask pattern of the manufactured EUV mask by scanning with an EUV light, an ultraviolet light, an electron beam or the like, or image recognition.

The present invention mainly relates to a reflective mask for EUV lithography that is used in manufacturing a semiconductor device using an EUV (Extreme Ultra-Violet) exposure technique, and a reflective mask blank for EUV lithography, that is a precursor of the reflective mask for EUV lithography. Here, in this specification, the reflective mask blank for EUV lithography is referred to as an "EUV mask blank" as well.

(Structure of EUV Mask Blank)

FIG. 1 is a cross-sectional view schematically illustrating a structure of an EUV mask blank 10. The EUV mask blank 10 includes a reflective layer 12 that reflects EUV light and an absorber layer 14 formed on the reflective layer 12 that absorbs the EUV light stacked on the substrate 11 in this order. Further, a protection layer 13 may be provided between the reflective layer 12 and the absorber layer 14 that protects the reflective layer 12 in etching of the absorber layer 14. Further, a low reflective layer 15 may be formed on the absorber layer 14 that has a low reflection characteristic to inspection light (light of 257 nm, for example) used for inspecting a mask pattern.

Here, in this specification, when it is expressed that "B on A" such as "an absorber layer on a reflective layer" or the like, a structure in which there is another functional layer included between A and B is also included, in addition to a structure in which A and B are adjacent with each other. In other words, when "an absorber layer on a reflective layer" is exemplified, not only a structure in which the absorber layer is stacked on the reflective layer as being in an adjacent relationship is included, but also a structure in which another functional layer is provided between the reflective layer and the absorber layer is also included. Further, the EUV mask blank 10 may include a functional layer that is known in the field of the EUV mask blank. For example, a conductive coating layer whose sheet resistance is less than or equal to 100Ω/□ may be provided at a rear surface side of the substrate 11 in order to promote electrostatic chucking of the EUV mask blank. In this case, the conductive coating layer may be formed by a known method such as magnetron sputtering, ion beam sputtering or the like. Each component that constitutes the EUV mask blank 10 is explained below.

(Substrate)

The substrate 11 is required to have a low thermal expansion coefficient, to have good smoothness and flatness and to have as few defects at its surface as possible, as a substrate used in the EUV mask blank. Specifically, the thermal expansion coefficient around room temperature (23° C. to 25° C.) is preferably within a range of $-0.05\times10^{-7}/°$ C. to $+0.05\times10^{-7}/°$ C., and more preferably, within a range of $-0.03\times10^{-7}/°$ C. to $+0.03\times10^{-7}/°$ C. As a material having such a thermal expansion coefficient, for example, a $SiO_2$—$TiO_2$ based glass or the like is preferably used. However, the material is not limited so, and a crystallized glass obtained by precipitating (β-quartz solid solution, a quartz glass, silicon, metal or the like may be used.

Further, the smoothness and the flatness required for the substrate 11 are, specifically, surface roughness less than or equal to 0.15 nm rms and flatness less than or equal to 100 nm according to the Japanese Industrial Standards JIS-B0601. By satisfying such ranges, the accuracy in transferring the pattern by the EUV light when manufacturing the EUV mask can be increased. Further, although the size, the thickness or the like of the substrate 11 may be arbitrarily determined based on a design value or the like of the EUV mask blank, as an example, the outer shape is about 6 inches (152 mm) square and the thickness is about 0.25 inches (6.35 mm).

In particular, it is preferable that a defect does not exist at a surface (referred to as a "main surface" as well), of the substrate 11 at which the reflective layer 12 is formed. In case when a defect exists, it is preferable that the defect be within a size that a phase defect is not generated. Specifically, it is preferable that the surface condition of the main surface be such that the depth of a concave defect and the height of a convex defect is less than or equal to 0.2 nm, and a half-width of the concave defect and the convex defect be less than or equal to 60 nm. Further, for the substrate 11, it is also required for a surface other than the main surface such as a surface (referred to as a "rear surface" as well) opposite to the main surface, a side surface or the like to have flatness and smoothness as good as possible in order not to generate a defect caused by particles or the like when forming the reflective layer or the like.

(Reflective Layer)

The reflective layer 12 is required to have high reflectance when irradiated by the EUV light. For a specific characteristic, when the EUV light with a wavelength of about 13.5 nm is irradiated, the maximum value of the reflectance is preferably greater than or equal to 60%, more preferably, greater than or equal to 63%, and furthermore preferably, greater than or equal to 65%. Here, the "reflectance" is obtained as reflectance intensity when the EUV light is irradiated in a direction that is inclined 6 degrees from a normal line with respect to the surface of the reflective layer 12. This angle condition is based on a fact that the EUV light is mainly irradiated in a direction that is inclined 6 degrees from a normal line of a surface of the EUV mask in a reflective optical exposure system using the EUV light.

In order to show high reflectance of the EUV light as such, for the reflective layer 12, a multilayer reflective film is preferably used in which a high reflective layer having high refractive index to the EUV light and a low reflective layer having low refractive index to the EUV light are alternately stacked a plurality of times. In particular, a Mo/Si multilayer reflective film in which a Si layer is used as the high reflective layer and a Mo layer is used as the low reflective layer is preferably used. Further, for the reflective layer 12, not limited to the Mo/Si multilayer reflective film, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may be used.

Further, for an uppermost layer of the multilayer reflective film that composes the reflective layer 12, a material that does not oxidize a reflective film is preferably selected, and as a cap layer having such a function, specifically, a Si layer may be exemplified. Then, when the reflective layer 12 is the Mo/Si multilayer reflective film, the uppermost layer may be the Si layer. Here, the Mo/Si multilayer reflective film may be formed by a known film deposition method such as, for example, ion beam sputtering, magnetron sputtering or the like. In each of the film deposition methods, the Mo/Si multilayer reflective film may be formed to have a predetermined thickness by arbitrarily selecting sputtering gas, gas pressure, deposition rate, a sputtering target or the like, and the Mo layer and the Si layer may be formed alternately for a predetermined number of times. Here, in this specification, the "reflective layer 12" is also expressed as a "multilayer reflective film 12".

(Protection Layer)

The protection layer 13 is provided to prevent damage to the reflective layer 12 in an etching process in which a pattern is formed on the absorber layer 14, or on the low reflective layer 15 and the absorber layer 14. Thus, for the protection layer 13, a material whose etching rate is slower than that of the absorber layer 14 when etching the absorber layer 14, and is hardly damaged in the etching process is preferably used. For the protection layer 13, Si, Cr, Al, Ta or nitride of these, Ru, a Ru compound, or $SiO_2$, $Al_2O_3$ or a mixture of these, or a stacked structure of these compounds is exemplified. Among these, Ru, a Ru compound, CrN, or $SiO_2$ is preferably used, and Ru or a Ru compound is more preferably used. Here, as the Ru compound, RuB, RuSi or the like may be exemplified.

Further, it is required for the EUV mask blank with the protection layer 13 that reflectance of the EUV light at a surface of the protection layer 13 be high. As a specific characteristic, the maximum value of the reflectance when the EUV light with a wavelength of about 13.5 nm is irradiated is preferably greater than or equal to 60%, more preferably, greater than or equal to 63%, and furthermore preferably, greater than or equal to 65%. In order to actualize such reflectance of the EUV light, for the protection layer 13, Ru or a Ru compound is preferably used, and the thickness may be within a range of 1 nm to 10 nm, preferably, within a range of 1 nm to 5 nm, and more preferably, within a range of 1.5 nm to 4 nm. Here, the protection layer 13 may be formed by a known film deposition method such as, for example, ion beam sputtering, magnetron sputtering or the like. In each of the film deposition methods, the protection layer 13 may be formed to have a predetermined thickness by arbitrarily selecting sputtering gas, gas pressure, deposition rate, a sputtering target or the like.

(Absorber Layer)

The absorber layer 14 is required to have a high optical absorption characteristic (low reflectance) when the EUV light is irradiated. In other words, when being irradiated by the EUV light, the EUV mask can actualize high contrast as high reflectance (greater than or equal to 60%) can be obtained at the reflective layer 12 while low reflectance is obtained at the absorber layer 14. Specifically, when the EUV light is irradiated, the reflectance at the surface of the absorber layer 14 is about 0.1% to 15%. For example, even when the reflectance at the surface of the absorber layer 14 is relatively high as about 15%, the high contrast can be actualized by using a phase effect if the phase difference of the reflected light at the surface of the reflective layer 12 and the reflected light at the surface of the absorber layer 14, of the EUV light is designed to be within about 175 degree to 185 degree.

The absorber layer 14 may be composed of a material that has a high absorption coefficient of the EUV light, and for example, a material containing tantalum (Ta) as a main component, a material containing chromium (Cr) as a main component, or a material containing palladium (Pd) as a main component is preferably used. Here, the material containing tantalum (Ta) as a main component means a material in which the content by percentage of Ta in the absorber layer 14 is greater than or equal to 40 at %. Further, when the absorber layer 14 is composed by the material containing Ta as a main component, the content by percentage of Ta is preferably greater than or equal to 50 at %, and more preferably, greater than or equal to 55 at %.

Further, the material containing chromium (Cr) as a main component means a material in which the content by percentage of Cr in the absorber layer 14 is greater than or equal to 40 at %. In this case, the content by percentage of Cr in the absorber layer 14 is preferably greater than or equal to 50 at %, and more preferably, greater than or equal to 55 at %.

Further, the material containing palladium (Pd) as a main component means a material in which the content by percentage of Pd in the absorber layer 14 is greater than or equal to 40 at %. In this case, the content by percentage of Pd in the absorber layer 14 is preferably greater than or equal to 50 at %, and more preferably, greater than or equal to 55 at %.

The material containing Ta as a main component that composes the absorber layer 14 preferably includes at least one component selected from hafnium (Hf), silicon (Si), zirconium (Zr), germanium (Ge), boron (B), palladium (Pd), chromium (Cr), hydrogen (H) and nitrogen (N), in addition to Ta. As a specific example for the material that includes the above described element in addition to Ta, TaN, TaNH, TaHf, TaHfN, TaBSi, TaBSiN, TaB, TaBN, TaSi, TaSiN, TaGe, TaGeN, TaZr, TaZrN, TaPd, TaPdN, TaCr, TaCrN or the like may be exemplified.

Further, the material containing Cr as a main component that composes the absorber layer 14 preferably includes at least one component selected from hafnium (Hf), silicon (Si), zirconium (Zr), germanium (Ge), boron (B), palladium (Pd), tantalum (Ta), hydrogen (H) and nitrogen (N), in addition to Cr. As a specific example for the material that includes the above described element in addition to Cr, CrN, CrNH, CrHf, CrHfN, CrBSi, CrBSiN, CrB, CrBN, CrSi, CrSiN, CrGe, CrGeN, CrZr, CrZrN, CrPd, CrPdN, CrTa, CrTaN and the like may be exemplified.

Further, the material containing Pd as a main component that composes the absorber layer 14 preferably includes at least one component selected from hafnium (Hf), silicon (Si), zirconium (Zr), germanium (Ge), boron (B), chromium (Cr), tantalum (Ta), hydrogen (H) and nitrogen (N), in addition to Pd. As a specific example for the material that includes the above described element in addition to Pd, PdN, PdNH, PdHf, PdHfN, PdBSi, PdBSiN, PdB, PdBN, PdSi, PdSiN, PdGe, PdGeN, PdZr, PdZrN, PdCr, PdCrN, PdTa, PdTaN or the like may be exemplified.

Further, the thickness of the absorber layer 14 may be within a range of 20 nm to 100 nm. When the thickness of the absorber layer 14 is greater than or equal to 20 nm, a sufficient absorption characteristic of absorbing the EUV light can be obtained and a sufficient contrast can be obtained by using the phase effect. Further, when the thickness of the absorber layer 14 is less than or equal to 100 nm, the pattern accuracy can be appropriately retained when manufacturing the EUV mask, and the transferring accuracy of the pattern can be appropriately retained even when inclined EUV light (6 degree) is irradiated on the EUV mask in the reflection exposure system. Further, the thickness of the absorber layer 14 is preferably within a range of 20 nm to 95 nm, and more preferably, within a range of 20 nm to 90 nm. Here, the absorber layer 14 may be formed by a known film deposition method such as, for example, ion beam sputtering, magnetron sputtering or the like. In each of the film deposition methods, the absorber layer 14 may be formed to have a predetermined thickness by arbitrarily selecting sputtering gas, gas pressure, deposition rate, a sputtering target or the like.

Smoothness is required for the surface of the absorber layer 14 because if the surface roughness of the surface of the absorber layer 14 is large, edge roughness of the pattern formed in the absorber layer 14 becomes large and accuracy of dimensions of the pattern is decreased. Specifically, the surface roughness may be less than or equal to 0.5 nm rms, preferably, less than or equal to 0.4 nm rms, and more preferably, 0.3 nm rms. In order to obtain such a smooth surface, it is preferable that a crystal structure of the absorber layer 14 be amorphous.

(Low Reflective Layer)

The low reflective layer 15 is a layer that has lower reflectance to the inspection light for inspecting the pattern of the absorber layer 14 than that of the absorber layer 14. For the inspection light, light with a wavelength of 257 nm is often used, for example. The inspection of the mask pattern shape or the like of the absorber layer 14 is performed using a difference between reflectances of the portion where the absorber layer 14 exists and the portion where the absorber layer 14 does not exist, and the protection layer 13 is often exposed at the portion where the absorber layer 14 does not exist. Further, when the low reflective layer 15 is stacked on the absorber layer 14 (the portion where the absorber layer 14 exists), the difference between the reflectances of the inspection light of the portion where the absorber layer 14 exists, and the portion where the absorber layer 14 does not exist becomes large, and the contrast is improved. Thus, high inspection accuracy can be obtained.

Here, the wavelength of the inspection light has a tendency to shift toward a short wavelength side as the pattern size becomes smaller, and it can be considered that the wavelength of the inspection light is shifted to 193 nm, and further can be shifted to 13.5 nm in the future. When the wavelength of the inspection light is 13.5 nm, it can be considered that it is not necessary for the low reflective layer 15 to be formed on the absorber layer 14.

The low reflective layer 15 is composed of a material whose refractive index to the wavelength of the inspection light is lower than that of the absorber layer 14. Specifically, a material containing Ta as a main component may be used. Further, other than Ta, the low reflective layer 15 includes one or more elements selected from Hf, Ge, Si, B, N, H and O. For a specific example, TaO, TaON, TaONH, TaBO, TaHfO, TaHfON, TaBSiO, TaBSiON, SiN, SiON or the like may be used.

Further, when depositing the low reflective layer 15 on the absorber layer 14, the total thickness of the absorber layer 14 and the low reflective layer 15 is preferably 20 nm to 100 nm, more preferably, 20 nm to 95 nm, and furthermore preferably, 20 nm to 90 nm. Further, it is preferable that the thickness of the low reflective layer 15 is less than that of the absorber layer 14 because there is a possibility that the EUV light absorption characteristic of the absorber layer 14 will be lowered when the thickness of the low reflective layer 15 is greater than that of the absorber layer 14. Thus, the thickness of the low reflective layer 15 is preferably 1 nm to 20 nm, more preferably, 2 nm to 15 nm, and further more preferably, 2 nm to 10 nm. Here, the low reflective layer 15 may be formed by a known film deposition method such as, for example, ion beam sputtering, magnetron sputtering or the like. In each of the film deposition methods, the low reflective layer 15 may be formed to have a predetermined thickness by arbitrarily selecting sputtering gas, gas pressure, deposition rate, a sputtering target or the like. Further, a natural oxide film that is naturally formed at a surface of the absorber layer 14 may be used.

(Fiducial Mark)

Next, a fiducial mark formed in the EUV mask blank 10 is explained. As described above, if contaminants are included mainly in the course of forming the reflective layer (multilayer reflective film) 12 or defects exist at the surface of the substrate 11, defects are also generated in the reflective layer 12. Thus, the fiducial mark is used for determining a fiducial position for specifying the position of each of the defects. The fiducial mark may be formed at the surface of the substrate 11 as a concave portion or a convex portion. Alternatively, the fiducial mark may be formed in a layer between the reflective layer 12 and the absorber layer 14, or in a layer between the reflective layer 12 and the low reflective layer 15 as a concave cross-sectional shape or a convex cross-sectional shape when the low reflective layer 15 is formed. Here, in this embodiment, a case is mainly explained in which a fiducial mark with a concave cross-sectional shape is formed in the reflective layer 12.

Figure 2:
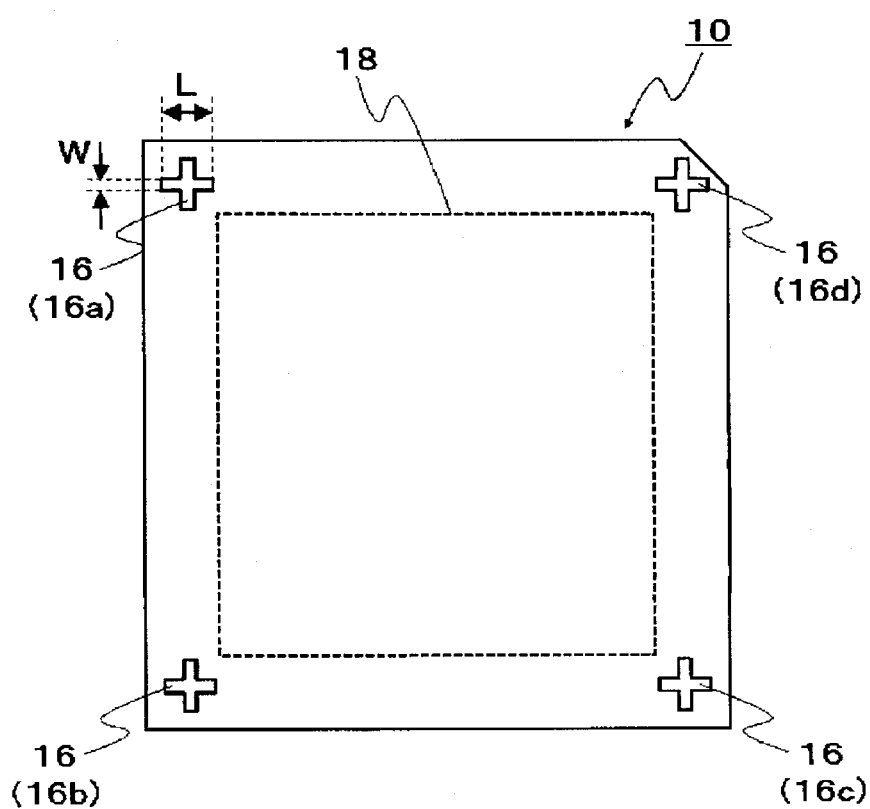
FIG. 2 is a plan view schematically illustrating an example of the EUV mask blank.

FIG. 2 is a plan view schematically illustrating an example of the EUV mask blank 10 in which positions and shapes, in a plan view, of fiducial marks 16 formed on the reflective layer 12 composed of a multilayer reflective film are exemplified. In FIG. 2, the fiducial marks 16 are positioned at an outside area from an actual mask pattern area 18 (an area of 132 mm×132 mm, for example). Further, when forming concave fiducial marks in the reflective layer 12, the concave fiducial marks 16 may be formed at an outermost surface of the reflective layer 12 by removing a part of the reflective layer 12. Alternatively, when the protection layer 13 is formed on the reflective layer 12, the fiducial marks 16 may be formed by removing a part of the reflective layer 12 from the surface of the protection layer 13 (by penetrating the protection layer 13). Here, in FIG. 2, when specifically explaining the positional relationship of the four fiducial marks 16, the fiducial marks 16 are expressed as fiducial marks 16a, 16b, 16c and 16d.

Further, although the four fiducial marks 16 have the same cruciform in FIG. 2, at least one of the fiducial marks 16a, 16b, 16c and 16d that are positioned at four corners of the EUV mask blank 10 may have a different shape from the other fiducial marks. Further, although the four fiducial marks 16 are positioned in rotation symmetry with respect to a center of the substrate in FIG. 2, the four fiducial marks 16 may have the same shape and at least one of the fiducial marks 16 may be formed at a position shifted from the position that is in rotation symmetry with the other fiducial marks 16. At this time, the fiducial mark 16 can be used to confirm the rotational position of the EUV mask blank and the EUV mask in addition to be used to specify the position of the defects of the EUV mask blank. Although the fiducial marks 16a, 16b, 16c and 16d are expressed as the same cruciform in FIG. 2, for example, the fiducial mark 16d may be formed to have a shape different from that of others, and the rotational position of the EUV mask blank 10 may be confirmed as a normal status when the fiducial mark 16d is positioned at upper right. At this time as well, the fiducial mark 16d may have a shape that has an intersection point, and for example, a shape in which lengths of two lines are different or the like may be used.

Here, although the fiducial mark of the embodiment is a cruciform, the shape of the fiducial mark is not specifically limited. The fiducial mark may be formed by at least two lines, where each of the lines that form the fiducial mark may be placed to extend along either of a plurality of virtual lines that are crossing at an intersection point, and at least one line may be placed to extend along each of the virtual lines, in a plan view. The fiducial mark is not limited to one having an explicit intersection point in a plan view as the fiducial marks 16 illustrated in FIG. 2 or the fiducial mark 101 illustrated in FIG. 17A and FIG. 17B.

Figure 18A:
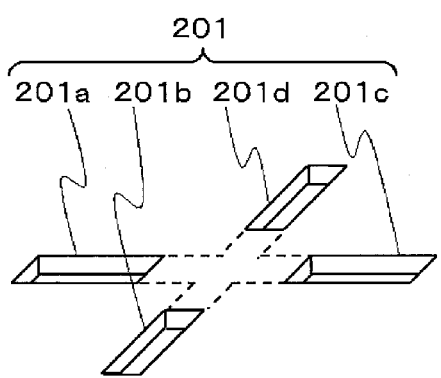
FIG. 18A is a perspective view schematically illustrating another example of the fiducial mark.
Figure 18B:
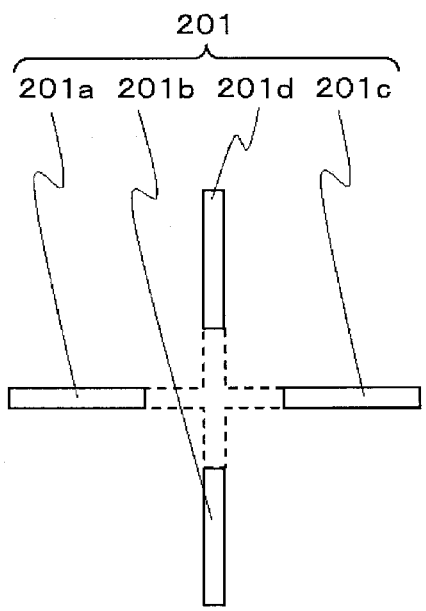
FIG. 18B is a plan view schematically illustrating another example of the fiducial mark.

For example, a fiducial mark 201 of an alternative example illustrated in FIG. 18A and FIG. 18B includes independent line shaped assistance marks 201a, 201b, 201c and 201d. When providing a "virtual line A" and a "virtual line B" as two virtual lines that are crossing with each other in a plan view, the assistance mark 201a and the assistance mark 201c are placed to extend along the virtual line A and the assistance mark 201b and the assistance mark 201d are placed along the virtual line B. Further, in other words, the virtual lines are lines that are extended along the assistance marks, respectively. Here, it is preferable that the virtual lines are straight lines in a plan view.

Broken lines in FIG. 18A and FIG. 18B express the two virtual lines that extend along the assistance marks, respectively. The fiducial mark 201 is formed by a group of assistance marks that are not crossing (overlapping) with each other in a plan view. The plurality of virtual lines that extend along the group of assistance marks cross with each other at an intersection point. In this case, it is preferable that the widths of the assistance marks that are placed along a single virtual line are the same.

Figure 19A:
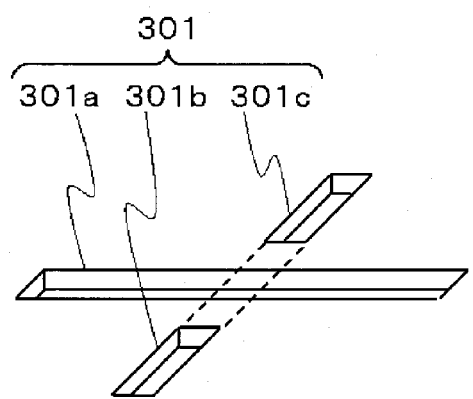
FIG. 19A is a perspective view schematically illustrating another example of the fiducial mark.
Figure 19B:
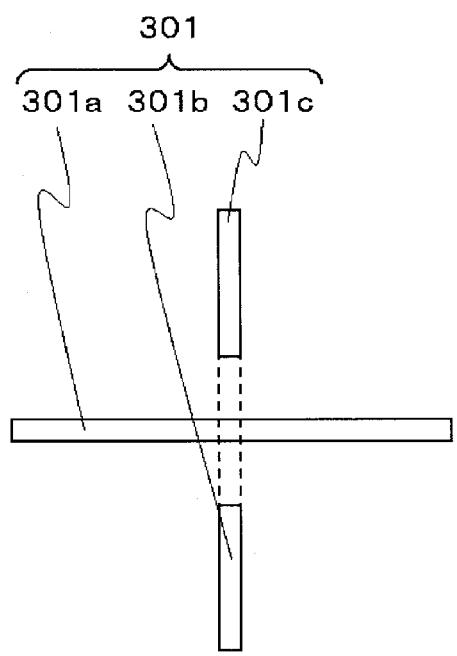
FIG. 19B is a plan view schematically illustrating another example of the fiducial mark.

Further, a fiducial mark 301 of an alternative example illustrated in FIG. 19A and FIG. 19B includes line shaped assistance marks 301a, 301b and 301c. When providing a "virtual line A" as a virtual line that is crossing with a virtual line extending along the assistance mark 301a in a plan view, the assistance mark 301b and the assistance mark 301c are placed to extend along the virtual line A.

Broken lines in FIG. 19A and FIG. 19B express the virtual line A that extends along the assistance mark 301b and the assistance mark 301c. The fiducial mark 301 is formed by a group of assistance marks that are not crossing (overlapping) with each other in a plan view. The virtual line that extends along the group of assistance marks crosses with a line (assistance mark 301a) at an intersection point. In this case, it is preferable that the widths of the plurality of assistance marks that are placed along a single virtual line are the same.

Figure 20A:
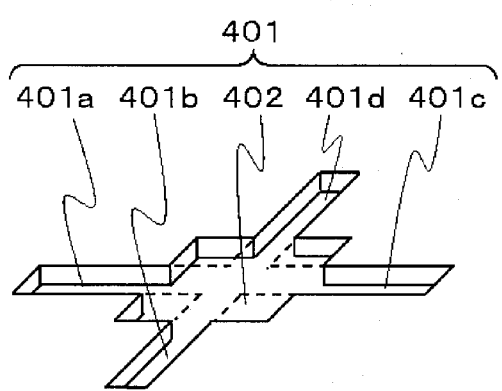
FIG. 20A is a perspective view schematically illustrating another example of the fiducial mark.
Figure 20B:
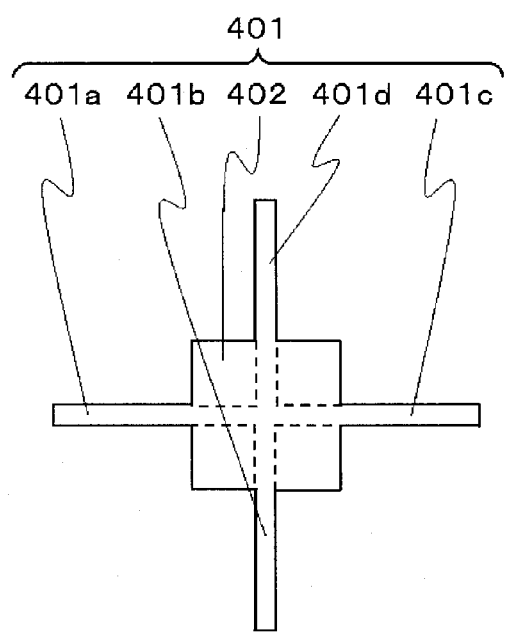
FIG. 20B is a plan view schematically illustrating another example of the fiducial mark.

Further, a fiducial mark 401 of an alternative example illustrated in FIG. 20A and FIG. 20B includes line shaped assistance marks 401a, 401b, 401c and 401d and a wide area mark 402 that is provided to be connected to the assistance marks 401a, 401b, 401c and 401d in a plan view. The width of the wide area mark 402 is greater than the width of each of these assistance marks. Further, when providing a "virtual line A" and a "virtual line B" as two virtual lines that are crossing with each other in a plan view, the assistance mark 401a and the assistance mark 401c are placed to extend along the virtual line A and the assistance mark 401b and the assistance mark 401d are placed to extend along the virtual line B. Further, in other words, the virtual lines are lines that are extended along the assistance marks of the fiducial mark 401, respectively, and it is preferable that the virtual lines be straight lines in a plan view.

Broken lines in FIG. 20A and FIG. 20B express the two virtual lines that extend along the assistance marks, respectively. The fiducial mark 401 does not include an explicit intersection point in a plan view. The plurality of virtual lines that extend along the group of the assistance marks cross at an intersection point, and the intersection point is positioned in the wide area mark 402. In this case, it is preferable that the widths of the plurality of assistance marks that are placed along a single line are the same.

Although each of the fiducial marks of the alternative examples illustrated in FIG. 18A to FIG. 20B does not include an explicit intersection point in a plan view, similar to the fiducial mark (the fiducial mark of cruciform, for example) that includes an explicit intersection point in a plan view, the fiducial position can be detected with a high accuracy in the step of inspecting the EUV mask after manufacturing the EUV mask. Hereinafter, typically, the explanation is made based on the cruciform fiducial mark.

Here, in this specification, a mark that is formed in the process of manufacturing the EUV mask blank 10, a mark of the EUV mask blank 10, and a mark of the EUV mask 30, which will be explained later, are all explained as the "fiducial mark". Then, during the process of manufacturing the EUV mask blank 10, for example, a fiducial mark that is formed in the reflective layer 12 is transferred to a layer (the absorber layer 14 or the low reflective layer 15, for example) that is formed on the fiducial mark, and becomes a fiducial mark for specifying the fiducial position of the reflective mask blank 10. Here, the transferred fiducial mark has substantially the same size and the same shape as the fiducial mark that is first formed. Then, the position of each of the defects of the reflective layer (multilayer reflective film) 12 can be specified by detecting the fiducial position from the fiducial mark and referring to information previously stored in the recording medium.

The fiducial mark may be formed to have a shape in accordance with its usage. For example, as illustrated in FIG. 2, each of the fiducial marks 16a, 16b, 16c and 16d is formed as cruciform in a plan view (seen from a direction that is orthogonal to a surface at which the fiducial marks 16a, 16b, 16c and 16d are formed). At this time, an intersection point between a center line of one straight portion and a center line of the other straight portion becomes an actual fiducial point (fiducial position). Here, as a cruciform, typically, a shape in which an angle between two lines is substantially orthogonal and the lengths of the two lines are substantially the same may be exemplified. However, this is not limited so and a shape in which the lengths of the two lines are different may be included. Further, in particular, it is important for the fiducial mark that the fiducial position can be specified from the shape of the fiducial mark. Thus, such as cruciform, a shape in which an intersection point of two or more lines can be specified as a fiducial position is preferably used. Further, the fiducial mark may have an L form. As such, in addition to above, for the shape of the fiducial mark in which the intersection point of lines is specified as the fiducial position, a shape in which two lines are crossing with an angle not orthogonal, a shape in which three or more lines cross with each other to form a single intersection point (including a shape such as "asterisk" or the like), or a shape in which a line other than a straight line is included for the lines crossing with each other may be used.

The fiducial mark is preferably formed to have a size that is detectable by a low-power observation, and the size may be set in accordance with the size tolerance or the like of the EUV mask blank 10. A size tolerance for each side (152.0 mm) of the standard EUV mask blank with a square shape is ±0.1 mm. When this EUV mask blank is set in a predetermined apparatus (an electron beam lithography apparatus, for example), the position of the EUV mask blank is determined, for example, by pressing two sides of the EUV mask blank to pins. At this time, the position of the fiducial mark may be shifted for ±0.1 mm for each EUV mask blank. Thus, the fiducial mark is preferably formed to have a size detectable by the low-power observation in order to detect the position of the fiducial mark in a short period. When the size tolerance is ±0.1 mm, it is preferable that the area of the fiducial mark in a plan view is 1 $\mu m^2$ to 1.5 $mm^2$. Each of the straight portions of the cruciform fiducial mark may have, for example, a width W of 0.2 $\mu m$ to 10 $\mu m$ and a length L of 10 $\mu m$ to 550 $\mu m$; and at this time, the area of the fiducial mark in a plan view is 3.96 $\mu m^2$ to 10,900 $\mu m^2$.

Here, although the lines that form the fiducial mark have the same width in this embodiment, alternatively, the lines may have different widths. Further, although each of the lines that form the fiducial mark has a constant width in this embodiment, alternatively, the widths of the lines may be varied in the middle thereof. In this specification, the width W means the maximum value of the width of each of the lines that form the fiducial mark.

Further, three or more of the fiducial marks 16 are formed at a surface to form the fiducial marks at the outside area from the actual mask pattern area 18 (an area of 132 mm×132 mm, for example) in FIG. 2, such that they are not to be placed on the same straight line. Then, one fiducial point among the three or more of the fiducial points is set as origin, a line that ties the origin and another fiducial point is set as X axis, and a line that ties the origin and one of the other fiducial points is set as Y axis. Here, the X axis and the Y axis may be orthogonal to each other. As such, the position of each of the defects can be specified using an XY coordinate system.

Further, when the fiducial mark is formed to be a concave portion by removing a part of the layer, the layer may be removed by a laser abrasion method, a FIB (Focused Ion Beam) method, a lithography method using patterning and etching of a resist, a nano-indentation method, a micromachining method (a mechanical micromachining using nm450 manufactured by RAVE LLC, for example) or the like. In particular, the FIB method or the lithography method is preferably used. Among these, it is preferable to use the FIB method because a material at a bottom portion of the reflective layer (multilayer reflective film) 12 is altered by metal ions used for processing and the contrast due to the material can be improved.

Further, when the cross-sectional shape of the fiducial mark 16 is a concave shape, it is preferable that the fiducial mark includes a step surface that has a predetermined angle (50° to 90°) with respect to the surface to form the fiducial mark and an off-set surface (inside bottom surface) that is substantially parallel to the surface to form the fiducial mark. Further, at this time, if the (concave) fiducial mark is formed after the reflective layer (multilayer reflective film) 12 is deposited, sharp edges can be formed. In addition to this, the reflectance of the concave fiducial mark to light (the inspection light for the reflective layer 12) with a predetermined wavelength is different from that of the perimeter of the fiducial mark. Here, as the inspection light, EUV light, ultraviolet light, visible light or the like may be used, and among these, the EUV light is preferably used as it can reach inside the reflective layer 12 composed of a multilayer reflective film and can inspect the inside.

When the cross-sectional shape of the fiducial mark 16 of the embodiment is the concave shape, the fiducial mark is formed by removing a part of the reflective layer 12 composed of a multilayer reflective film, and when the EUV light is used as the inspection light, the reflectance of the EUV light is lowered compared with that of the multilayer reflective film 12 at the perimeter of the fiducial mark. As a result, the contrast between the fiducial mark and its perimeter becomes high. Here, the difference (absolute value) between the reflectance of the fiducial mark to the inspection light and that of the perimeter of the fiducial mark to the inspection light is preferably greater than or equal to 0.2%, more preferably, greater than or equal to 0.5%, and furthermore preferably, greater than or equal to 1.0%.

Figure 3:
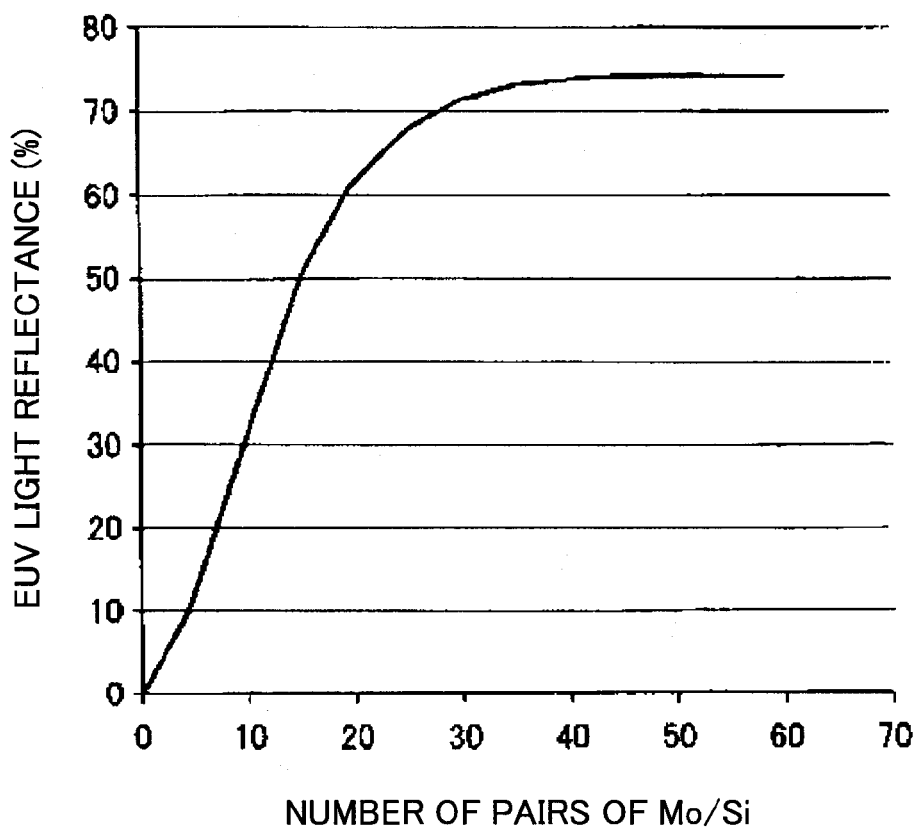
FIG. 3 is a view illustrating an example of a relationship between EUV light reflectance and the number of pairs of Mo/Si in a Mo/Si multilayer reflective film.

FIG. 3 is a view illustrating a relationship between the EUV light reflectance and the number of pairs of Mo/Si, of the Mo/Si multilayer reflective film. In FIG. 3, the thickness of the Mo layer is 2.3 nm±0.1 nm, the thickness of the Si layer is 4.5 nm±0.1 nm and the wavelength of the EUV light is 13.5 nm. As illustrated in FIG. 3, the reflectance of the EUV light becomes small as the number of pairs of Mo layer and Si layer decreases. Here, when forming the fiducial mark by removing a part of the Mo/Si multilayer reflective film, in order to increase the contrast with respect to the perimeter, the fiducial mark is preferably formed by removing greater than or equal to two pairs of Mo layer/Si layer, and more preferably, greater than or equal to five pairs of Mo layer/Si layer may be removed. As the thickness of the pair of Mo layer/Si layer is about 7 nm, the depth of the fiducial mark formed as such becomes about greater than or equal to 14 nm for the former case, and greater than or equal to 35 nm for the latter case. At this time, the reflectance of the fiducial mark to the EUV light becomes lower than that of the perimeter. Here, the number of pairs to be finally removed may also be controlled by the number of pairs of the (Mo/Si) multilayer reflective film that are removed in a step of etching the absorber layer (S6), which will be explained later, when the reflective layer 12 is also etched with the absorber layer 14 in the step of etching the absorber layer (S6).

Further, regardless of the kind of a surface at which the fiducial mark is formed, the material of the bottom portion of the fiducial mark may be a MoSi compound that is generated by a reaction of the Mo layer and the Si layer when processing the fiducial mark. Although the reflection of the EUV light occurs due to the difference between the refractive indexes of the Mo layer and the Si layer, when the MoSi compound is generated by the reaction of the Mo layer and the Si layer, the difference between the refractive indexes disappears. Thus, the EUV light reflectance of the fiducial mark can be further lowered.

Further, when the number of pairs is greater than or equal to 10 in the Mo/Si multilayer reflective film, reflectance to the ultraviolet light or the visible light varies mainly by a material of a surface of the Mo/Si multilayer reflective film to which the light is injected. Thus, when the fiducial mark is formed at the surface of the Mo/Si multilayer reflective film, it is preferable that the material of the bottom portion of the fiducial mark is different from a material of the uppermost layer (a layer at an opposite side of a substrate side) of the Mo/Si multilayer reflective film in order to increase the contrast with the perimeter. For example, when the uppermost layer of the multilayer reflective film is Si, the material of the bottom portion of the fiducial mark may be a MoSi compound that is formed by a reaction of a Mo layer and a Si layer when processing the fiducial mark. At this time, the reflectance of the fiducial mark to the ultraviolet light or the visible light becomes lower than that of the perimeter. Further, the material of the bottom portion of the fiducial mark may be oxide, nitride or oxynitride of Mo, Si or the MoSi compound that is formed by oxidizing, nitriding, oxynitriding the Mo layer or the Si layer when processing the fiducial mark. At this time, the reflectance of the fiducial mark to the ultraviolet light or the visible light becomes lower than that of the perimeter.

Further, when the number of pairs of the Mo/Si multilayer reflective film is less than or equal to 5, the reflectance of the visible light becomes high. Thus, the fiducial mark in which the number of pairs is less than or equal to 5 may be formed. At this time, the visible light reflectance of the fiducial mark becomes higher than that of its perimeter. Further, the reflectance to the ultraviolet light or the visible light may be varied depending on the existence of the protection layer 13 (Ru, for example). Thus, when the fiducial mark is formed at the surface of the protection layer 13, it is preferable to form a concave fiducial mark that penetrates the protection layer 13 in order to increase the contrast between the fiducial mark and its perimeter. At this time, as the material of the bottom portion of the fiducial mark is different from the material of the protection layer 13, the light reflectance of the fiducial mark becomes higher or lower than that of its perimeter.

Here, when the fiducial mark is formed after the deposition of the reflective layer 12, the fiducial mark is transferred to the absorber layer 14 or the like whose thickness is less (about ¼) than that of the reflective layer 12. In such a case, the transferred fiducial mark has substantially the same shape as the first formed fiducial mark. Therefore, repeatability of detecting a position by the inspection light (electron beam, ultraviolet light, visible light, EUV light) becomes good and the following effects (1) to (2) can be obtained.

(1) In a step of manufacturing an EUV mask 30, an electron beam lithography apparatus (EBM8000 manufactured by NuFlare Technology Inc. or the like, for example), a laser plotting device, a mask pattern coordinate measurement apparatus (IPRO5 manufactured by KLA-Tencor Corporation or the like, for example) or a mask pattern inspection apparatus (Teron610 manufactured by KLA-Tencor Corporation or the like, for example) is capable of detecting the position of the fiducial mark by the electron beam or the ultraviolet light with good repeatability. Thus, such an apparatus can accurately detect the position of each of the defects of the reflective layer 12 or the like based on information provided by a supplier of the reflective mask blank 10.

(2) The position of the fiducial mark can be detected with good repeatability when inspecting the absorber layer 14 and the low reflective layer 15 by the ultraviolet light or the visible light.

Here, although the embodiment is explained in which the fiducial mark 16 is formed on the reflective layer 12 as the concave portion and is transferred, this is not limited so. For example, the fiducial mark 16 may be formed on the absorber layer 14 or on the substrate 11 and may be transferred, or the fiducial mark 16 may be formed from the upper side of the low reflective layer 15 in a concave shape. Further, the fiducial mark 16 may be formed at the surface of the substrate 11, or at a surface of a layer between the reflective layer 12 and the low reflective layer 15 by stacking a predetermined material in a convex shape.

Then, when forming the fiducial mark to have a convex cross-sectional shape, a material that becomes a base of the fiducial mark is selected such that light reflectances of the fiducial mark and its perimeter become different. The material that becomes the base of the fiducial mark is not specifically limited; however, for example, as the material capable of being deposited using a known apparatus, Si or Mo used for the reflective layer (multilayer reflective film) 12, Ta, Cr, Pt, W, C or oxide or nitride thereof, used for the absorber layer 14 or the like may be used. The fiducial mark that is formed into the convex shape by stacking the material selected from these have low EUV light reflectance compared with its perimeter. Here, it is preferable that the difference (absolute value) between the reflectance of the fiducial mark using the inspection light and the reflectance of the perimeter of the fiducial mark using the inspection light is greater than or equal to 0.2%, more preferably, greater than or equal to 0.5%, and furthermore preferably, greater than or equal to 1.0%.

When the cross-sectional shape of the fiducial mark is a convex shape, the fiducial mark may be formed by first depositing a material that becomes the base of the fiducial mark on a surface and then removing the material at an unnecessary portion by the lithography method, or the fiducial mark may be formed by selectively depositing the material that becomes the base of the fiducial mark on the surface. For the latter case, a method of selectively depositing a metal film such as platinum, tungsten or the like is known by which an appropriate gas is selected in accordance with the desired material to be deposited, and irradiating with ion beams or electron beams under an atmosphere containing a metal compound (tungsten hexacarbonyl, for example) such as platinum, tungsten or the like and a hydrocarbon compound (naphthalene, phenanthrene or the like) to promote a decomposition reaction of the metal compound.

When the fiducial mark 16 has a convex cross-sectional shape, a shape can be adopted in accordance with its usage, and for example, if the fiducial mark 16 is formed as a cruciform in a plan view, the intersection point can be specified as a fiducial position. Further, for the convex shape, the shape of the fiducial mark, the number of the fiducial marks, the size, the area, and the positions of the fiducial marks in the EUV mask blank 10 may be considered as similar to that explained above for the concave fiducial mark. Here, when the cross-sectional shape of the fiducial mark 16 is a convex shape, the height may be appropriately set in accordance with the kind of or the thickness of the layer deposited on the fiducial mark. At this time, the height of the convex fiducial mark is, for example, 2 nm to 300 nm, preferably, 7 nm to 150 nm, and more preferably, 15 nm to 120 nm.

Further, when the cross-sectional shape of the fiducial mark 16 is a convex shape and a material that is the base of the fiducial mark is formed after the deposition of the reflective layer 12 composed of a multilayer reflective film, the reflectance of the convex fiducial mark using the EUV light, when the EUV light is the inspection light, is lower than that of the reflective layer 12 at the perimeter of the fiducial mark. Thus, when inspecting the defects of the reflective layer 12 using the EUV light, the contrast between the fiducial mark and its perimeter becomes high, and the position of the fiducial mark can be detected with good repeatability. Thus, the position of the defect of the reflective layer 12 can be accurately specified based on the fiducial position of the fiducial mark. Further, by selecting a material whose reflectance of the ultraviolet light to the visible light is different, the fiducial mark may be manufactured by which the position of the fiducial mark can be detected with good repeatability in the inspection using the ultraviolet light to the visible light.

Further, when the cross-sectional shape of the fiducial mark 16 is a convex shape and the material that becomes the base of the fiducial mark is formed after the deposition of the reflective layer 12 composed of a multilayer reflective film, the shape is transferred to the absorber layer 14 or the like whose thickness is thinner (about ¼) than that of the reflective layer 12. Thus, the shape of the transferred fiducial mark is substantially the same as that of the first formed fiducial mark, and repeatability of detecting a position by the inspection light (electron beam, EUV light, ultraviolet light, visible light, EUV light, for example) becomes good and the following effects (1) to (2) can be obtained.

(1) In a step of manufacturing the EUV mask 30, an electron beam lithography apparatus, a coordinate measurement apparatus or a mask appearance inspection apparatus is capable of detecting the position of the fiducial mark by the electron beam or the ultraviolet light with good repeatability. Thus, such an apparatus can accurately detect the position of each of the defects of the reflective layer 12 or the like based on information provided by a supplier of the reflective mask blank 10.

(2) The position of the fiducial mark can be detected with good repeatability when inspecting the absorber layer 14 and the low reflective layer 15 by the ultraviolet light or the visible light.

(Manufacturing EUV Mask Blank with Resist Film and Manufacturing EUV Mask)

Figure 4:
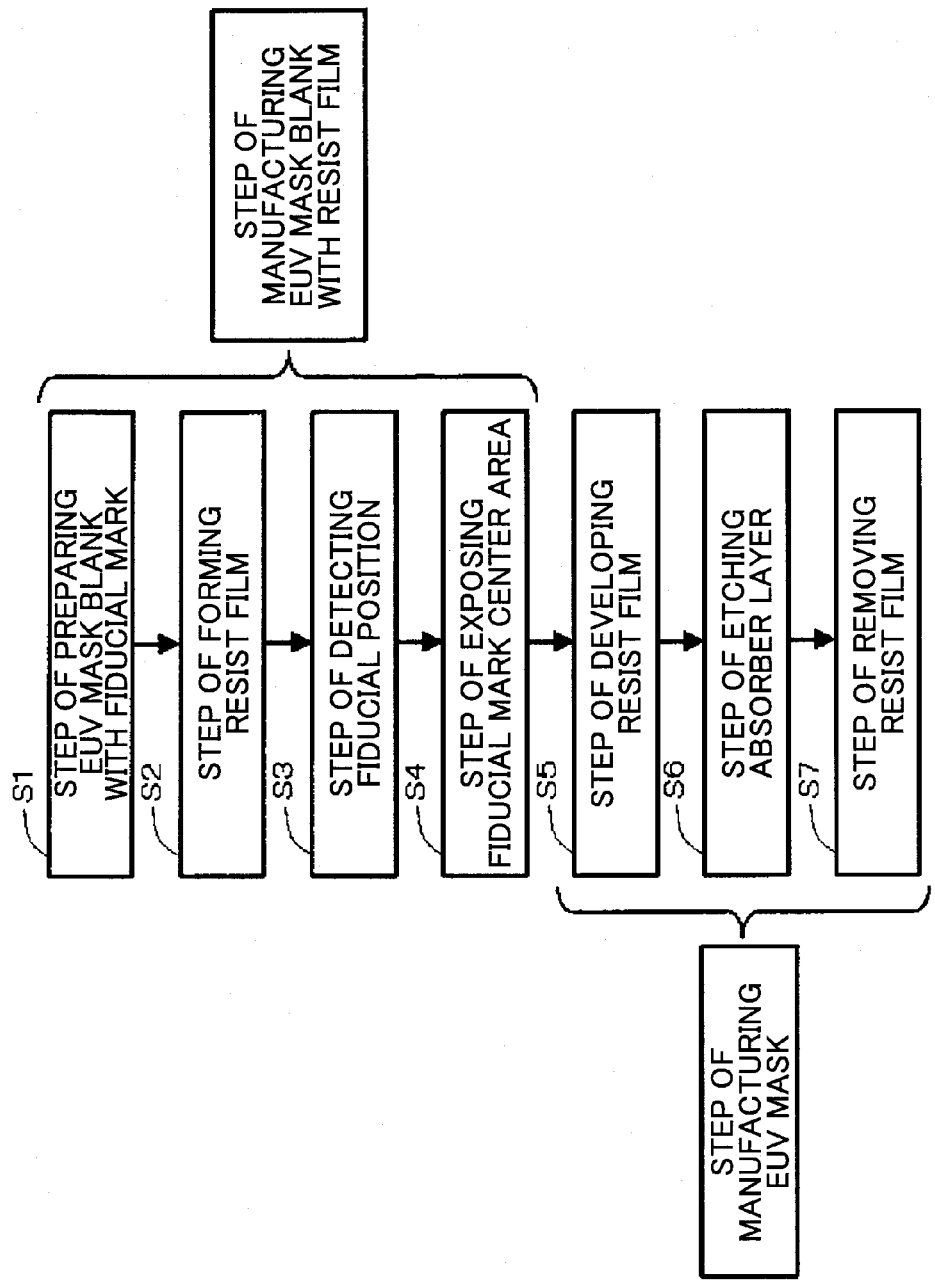
FIG. 4 is a flowchart illustrating an example of manufacturing methods of the EUV mask blank with a resist film and an EUV mask.

Next, a step of manufacturing the EUV mask blank with a resist film and a step of manufacturing the EUV mask is explained with reference to the flowchart of FIG. 4. First, the step of manufacturing the EUV mask blank with a resist film includes a step of preparing the EUV mask blank with a fiducial mark (S1), a step of forming a resist film (S2), a step of detecting the fiducial position (S3) and a step of exposing a fiducial mark center area (S4). Here, the EUV mask blank with a resist film of the embodiment is obtained after the step of exposing the fiducial mark center area (S4). Here, as will be explained later, for the EUV mask blank with a resist film of the embodiment, drawing by the electron beam on the mask pattern area may be performed before or after the step of exposing the fiducial mark center area and both cases are included in the embodiment.

Then, the step of manufacturing an EUV mask includes a step of developing the resist film of the EUV mask blank with a resist film on which the drawing by the electron beam (pattern) on the mask pattern area is performed (S5), a step of etching the absorber layer (S6) and a step of removing the resist film (S7). Here, the product after the step of removing the resist film is the EUV mask. Next, the method of manufacturing the EUV mask blank with a resist film and the method of manufacturing the EUV mask of the embodiment are explained in detail with reference to the flowchart of FIG. 4.

(S1: Step of Preparing EUV Mask Blank with Fiducial Mark)

Figure 5A:
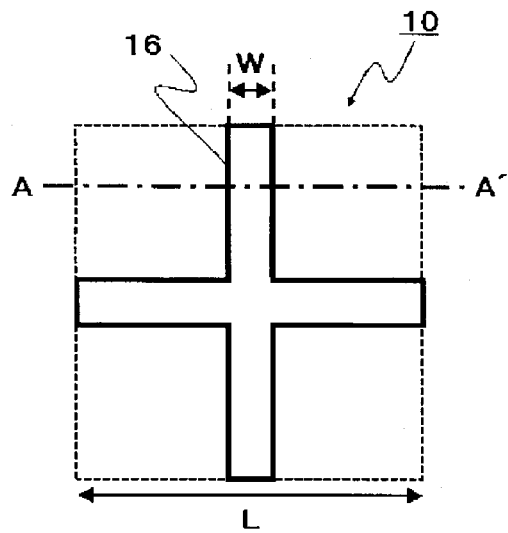
FIG. 5A is a plan view schematically illustrating an example of a fiducial mark.

First, the EUV mask blank 10 (without a resist film) before the step of manufacturing the EUV mask blank with a resist film is explained. FIG. 5A is an enlarged plan view schematically illustrating a cruciform fiducial mark 16 of the EUV mask blank 10 whose length is L and width is W. Here, accurately, the fiducial position corresponds to a crossing point of a center line (a line via a position of W/2) of one of the straight lines and a center line of the other of the straight lines, however, in this specification, the fiducial position is simply expressed as an "intersection point of two lines".

Figure 5B:
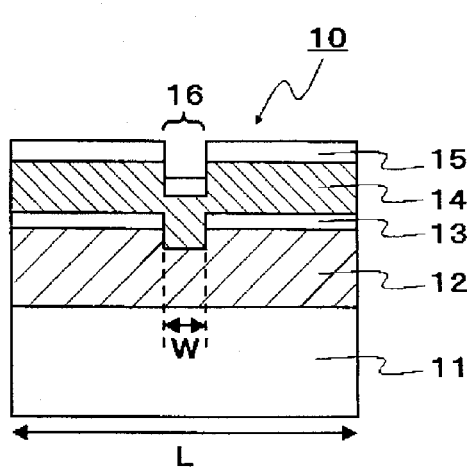
FIG. 5B is a cross-sectional view schematically illustrating an example of the fiducial mark.

FIG. 5B is a cross-sectional view schematically illustrating the EUV mask blank 10 including the fiducial mark 16 taken along an A-A' line of FIG. 5A.

Figure 6:
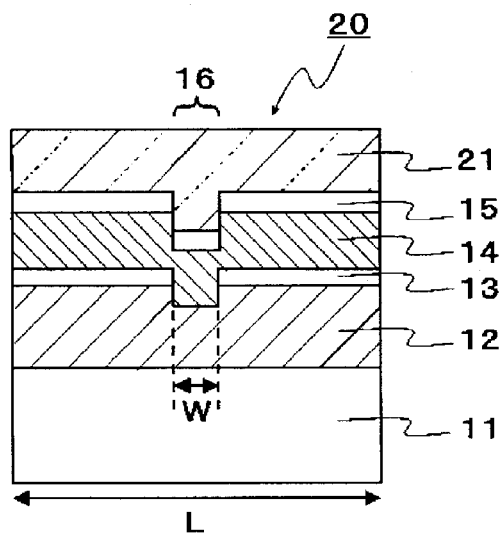
FIG. 6 is a cross-sectional view schematically illustrating an example of a fiducial mark portion of the EUV mask blank with a resist film.

Here, in FIG. 5B and FIG. 6, the width of the concave fiducial mark formed in the reflective layer 12 is expressed as "W", and the width of the fiducial mark in the absorber layer 14 and in the low reflective layer 15 that is transferred to have the substantially the same shape on the reflective layer 12 is also expressed as "W". Here, when the width of the fiducial mark becomes narrow due to a material that is deposited at a wall surface of a groove and the shape is varied from substantially the same shape, the value of "W" expresses the maximum value (the greatest width) of the width of the fiducial mark formed in each of the layers. Hereinafter, the flowchart illustrated in FIG. 4 is explained with reference to the cross-sectional view of FIG. 5B that schematically illustrates the EUV mask blank 10.

First, the reflective layer 12 composed of a multilayer reflective film (Mo/Si multilayer reflective film) including Mo layers and Si layers alternately stacked with each other, for example, is formed on the substrate 11, and the protection layer 13 composed of Ru or the like is formed on the reflective layer 12. Thereafter, a concave cruciform mark is formed by etching the protection layer 13 and the reflective layer 12 using a FIB method or the like from the surface of the protection layer 13 to the depth at which a part of the reflective layer 12 is removed. Here, the "part of the reflective layer 12" means, as described above, for the Mo/Si multilayer reflective film, two or more pairs of Mo layer/Si layer of the reflective layer 12 from its outermost surface. Here, by the process using the FIB method or the like, the fiducial mark having a concave cross-sectional shape cruciform mark with the width W is formed by a portion where the protection layer 13 is exposed and a portion where the part of the multilayer reflective film that composes the reflective layer 12 is removed. Next, the absorber layer 14 such as TaN or the like is deposited, and the low reflective layer 15 such as TaON or the like is deposited on the absorber layer 14. Thus, the cruciform fiducial mark 16 with a concave cross-sectional shape is transferred on the low reflective layer 15.

(S2: Step of Forming Resist Film)

Before drawing a pattern for EUV mask on the EUV mask blank 10 with the fiducial marks 16 by electron beam, a resist film is coated. FIG. 6 is a cross-sectional view schematically illustrating an EUV mask blank 20 with a resist film in which a resist film 21 is provided on the EUV mask blank 10. For the resist, in particular, chemical amplification type resist having high sensitivity to a small amount of light is preferably used, and the EUV mask blank 20 with a resist film is obtained by supplying (chemical amplification type) resist, forming the resist film 21 with a uniform thickness by spin coating or the like, and baking it for a predetermined period. Here, the surface of the (concave) fiducial mark 16 that is transferred to the low reflective layer 15 is flattened to a certain extent after the step of forming the resist film as the groove portion is covered by the resist film 21.

Here, even when the concave fiducial mark is formed on a place different from the reflective layer 12, such as on the substrate 11 or on the absorber layer 14, for example, as the EUV mask blank 10, the groove portion of the concave fiducial mark 16 is covered by the resist film 21 so that the fiducial mark exists at the surface of the EUV mask blank 10 is flattened to a certain extent. Further, even when the convex fiducial mark is formed, the convex portion is covered by the resist film and the surface of the resist film is flattened to a certain extent.

(S3: Step of Detecting Fiducial Positions)

Next, the (concave) fiducial marks 16 that exist under the resist film 21 are detected by scanning with the focused electron beam or the focused ultraviolet light to irradiate the surface of the resist film 21 of the EUV mask blank 20 covered with the resist film 21. For example, the existence of the fiducial mark 16 can be confirmed by detecting variation of the reflectance generated at the groove of the fiducial mark 16 by repeating scanning with the electron beam in the Y axis direction, shifting in the X axis direction for a predetermined space and then scanning with the electron beam in the Y axis direction again, based on the X axis direction and the Y axis direction illustrated in FIG. 7. After detecting the fiducial mark 16 for the first time, by repeating scanning with the electron beam in the Y axis direction (rough detection), the fiducial mark 16 may be further detected (precise detection) by making the shifting space in the X axis direction smaller.

Thereafter, by repeating scanning with the electron beam or the ultraviolet light in the X axis direction, shifting in the Y axis direction for a predetermined space and then scanning with the electron beam in the X axis direction again, the position of the intersection point of the cross of the cruciform can be detected. Here, the scanning direction is not specifically limited as described above, and the scanning with the electron beam or the ultraviolet light may be performed in an arbitrarily direction, other than the X axis direction and the Y axis direction in FIG. 7, and then be shifted in another arbitrarily direction for a predetermined space. For example, the space of the scanning (space in the Y axis direction for the scanning to the X axis direction) may be appropriately adjusted within a range of 0.1 μm to 100 μm.

Figure 7:
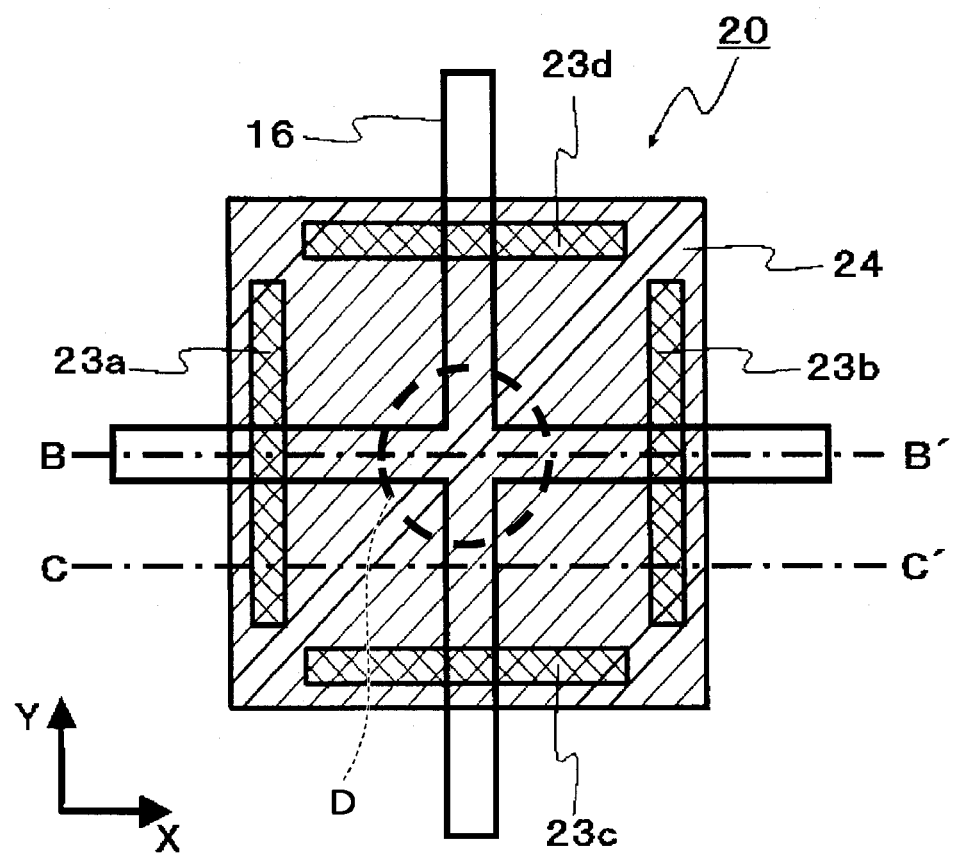
FIG. 7 is a plan view schematically illustrating an example of the fiducial mark portion of the EUV mask blank with a resist film.

FIG. 7 is a plan view schematically illustrating a status including a part of scan traces 23a, 23b, 23c and 23d formed on the resist film 21 by scanning with the electron beam or the ultraviolet light in the step of detecting the fiducial position for specifying the fiducial position based on the detection of the fiducial marks 16.

The electron beam or the ultraviolet light that scans for detecting the fiducial mark 16 exposes the resist film 21 that is formed at the surface in no small way. In such a case, if the EUV mask is obtained after performing the step or developing the resist film 21 as it is, the structure in the vicinity of the fiducial mark 16 becomes complicated, and there is a possibility that the detection accuracy of the fiducial mark 16 is lowered. Here, in order to suppress the lowering of the detection accuracy, in this embodiment, the step of exposing the fiducial mark center area, which will be explained below, is performed.

(S4: Step of Exposing Fiducial Mark Center Area)

After detecting the fiducial position corresponding to the intersection point of the two lines that form each of the cruciform fiducial marks 16 in the step of detecting the fiducial position, a specific area (hereinafter, referred to as an "exposed area 24") of the resist film 21 including the intersection point is exposed in a step of exposing a fiducial mark center area.

The exposed area 24 may be an area at least including an intersection point of a plurality of virtual lines set for the fiducial mark 16 (the intersection point of two lines that form the cruciform fiducial mark in FIG. 7) and including a circular area (referred to as a "circular area D" as well) expressed by a bold broken line D in FIG. 7. In FIG. 7, the circular area D is centered at the intersection point (the intersection point of two lines that form the cruciform fiducial mark in FIG. 7) of the virtual lines that are set for the fiducial mark. The circular area D has a radius that is 1.5 times the maximum value W of the width of the line of the fiducial mark.

When the exposed area 24 matches the circular area D, exposed portions are formed at both sides of each of the lines of the fiducial mark 16, where the exposed portions have widths about the same as those of the respective lines. Thus, when scanning with the electron beam or the like in a direction that is orthogonal to the line of the fiducial mark 16, the contrast (difference in reflectance) between the line of the fiducial mark 16 and its perimeter becomes clear, and the line of the fiducial mark 16 and the fiducial position of the fiducial mark 16 can be easily detected. The exposed area 24 does not necessarily match the circular area D as long as it includes the circular area D. For example, as illustrated in FIG. 7, the exposed area 24 may be a square area centered at the intersection point in which each side has a length three times the width W.

Further, it is preferable that the exposed area 24 includes a circular area that is centered at the intersection point and with a radius that is two times the width W of the line of the fiducial mark 16, and more preferably, the exposed area 24 includes a circular area that is centered at the intersection point and with a radius that is three times the width W of the line of the fiducial mark 16. Further, the exposed area 24 may be a square area centered at the intersection point in which each side has a length four times the width W, and more preferably, each side has a length six times the width W.

Here, at this time, an outer edge shape of the exposed area 24 in a plan view is not limited to a circular shape or a square shape and any shapes may be used. If the exposed area 24 is narrower than the above described circular area D, centered at the intersection point with a radius that is 1.5 times the width W of the line of the fiducial mark 16, there is a possibility that the fiducial position cannot be sufficiently detected in this step (S4). Further, the exposed area 24 may include a circular area or a square that covers the entirety of the fiducial mark 16. Meanwhile, long as the exposed area 24 is provided at outside area from the mask pattern area and does not overlap the mask pattern area, there is no upper limit.

In the step of detecting the fiducial position, the resist film 21 is exposed in accordance with an amount of exposure of the electron beam or the ultraviolet light, and when the amount of exposure becomes greater than or equal to a predetermined amount, for the positive resist, the resist is completely dissolved by a developing agent.

In the step of exposing the fiducial mark center area, for the positive resist, the exposure is preferably performed to at least an amount (a predetermined amount of exposure) such that the exposed area 24 that is exposed is completely dissolved by the developing agent. Further, at this time, when the exposed area 24 includes the scan traces 23a, 23b, 23c and 23d, even though a part of the resist film 21 corresponding to the scan traces 23a, 23b, 23c and 23d is exposed previously in the step of detecting the fiducial position, in the step of exposing the fiducial mark center area, the exposure is preferably performed with an amount more than or equal to the predetermined amount of exposure such that the scan traces 23a, 23b, 23c and 23d and the other area within the exposed area 24 become the same status.

When radiating the electron beam to irradiate the exposed area 24, although the optimum amount of exposure varies based on the kind of the resist, the developing condition or the like, for example, the amount of exposure per unit area of the exposed area 24 may be greater than or equal to 3 $\mu C/cm^2$, preferably, greater than or equal to 5 $\mu C/cm^2$, more preferably, greater than or equal to 10 $\mu C/cm^2$, and furthermore preferably, greater than or equal to 20 $\mu C/cm^2$. Further, when irradiating with the ultraviolet light, although the optimum amount of exposure varies based on the kind of the resist, the developing condition or the like, for example, the amount of exposure per unit area of the exposed area 24 may be greater than or equal to 5 $mJ/cm^2$, preferably, greater than or equal to 10 $mJ/cm^2$, and furthermore preferably, greater than or equal to 20 $mJ/cm^2$. Further, a method of irradiating with the electron beam or the ultraviolet light on the exposed area 24 may be actualized by two dimensionally scanning with the electron beam or the ultraviolet light, or by a block exposure (one-shot exposure) in which the electron beam or the ultraviolet light is irradiated onto an area corresponding to the exposed area 24. Here, it is effective to use the method of two dimensionally scanning with the electron beam on the exposed area 24 because the electron beam lithography apparatus that draws the pattern for the EUV mask can be used as it is and the manufacturing steps can be shortened, or the like.

Further, when manufacturing the EUV mask, a step of drawing a mask pattern is performed in which an actual pattern is drawn (exposed) at a mask pattern area of the EUV mask blank 20 with a resist film by an electron beam lithography apparatus or the like. Here, the step of drawing the mask pattern may be performed prior to or after the step of exposing the fiducial mark center area. This means that the step of drawing the mask pattern may be performed at any time after the step of detecting the fiducial position (S3) and before developing the coated resist film (S5). Thus, the EUV mask blank 20 with a resist film of the embodiment includes both cases in which the pattern is drawn (exposed) in the actual mask pattern area and the pattern is not yet drawn (exposed) in the actual mask pattern area as long as the exposed area 24 is exposed.

FIG. 8A to FIG. 8D are cross-sectional views schematically illustrating the structure taken by a B-B' line in FIG. 7. FIG. 9A to FIG. 9D are cross-sectional views schematically illustrating the structure taken by a C-C' line in FIG. 7. Here, the EUV mask blank 20 with a resist film after the step of exposing the fiducial mark center area has a structure as illustrated in FIG. 8A and FIG. 9A. This means that, in FIG. 8A and FIG. 9A, the portion where the electron beam or the ultraviolet light is irradiated in the step of exposing the fiducial mark center area, becomes an exposed portion 24a while the portion where the electron beam or the ultraviolet light is not irradiated in the step of exposing the fiducial mark center area, becomes a non-exposed portion 25. Here, when the resist film 21 (not illustrated in FIG. 8A and FIG. 9A) is a positive resist, the exposed portion 24a is exposed to an extent that it is completely dissolved in the following developing step. On the other hand, when the resist film 21 is a negative resist, the exposed portion 24a is exposed to an extent that it is not dissolved in the following developing step.

(S5 to S7: Step of Manufacturing EUV Mask)

FIG. 8A to FIG. 8D and FIG. 9A to FIG. 9D are also schematic views illustrating steps of manufacturing the EUV mask from the EUV mask blank with a resist film.

As described above, FIG. 8A and FIG. 9A are cross-sectional views schematically illustrating the EUV mask blank 20 with a resist film, after the step of exposing the fiducial mark center area. FIG. 8B and FIG. 9B are cross-sectional views schematically illustrating a status after developing the resist film 21 in which the exposed portion 24a of the resist film 21 is dissolved by a developing agent (S5). Further, FIG. 8C and FIG. 9C are cross-sectional views schematically illustrating a status after removing the low reflective layer 15 and the absorber layer 14 below the low reflective layer 15 that are exposed from the resist film 21 by etching (S6), after developing the resist film. Further, FIG. 8D and FIG. 9D are cross-sectional views schematically illustrating a status after removing the remaining resist film 21 (non-exposed portion 25) (S7), after etching the absorber layer 14. The structure illustrated in FIG. 8D and FIG. 9D corresponds to the EUV mask 30.

FIG. 8D and FIG. 9D are two typical cross-sectional views schematically illustrating the EUV mask 30. In particular, the cross-sectional shape of the cruciform portion in a plan view that corresponds to the fiducial mark 16 is a concave portion with respect to its perimeter, and specifically, a portion of the reflective layer 12, a part of which is removed, is exposed at a surface. Further, among the exposed area 24, at an area other than the cruciform portion, the protection layer 13 is exposed.

Figure 10:
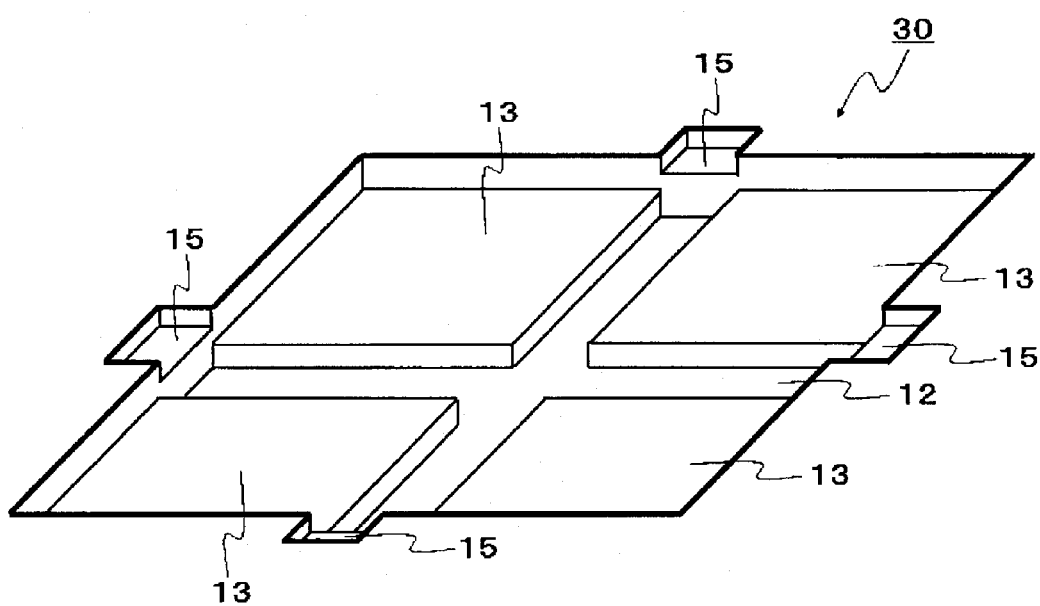
FIG. 10 is a perspective view schematically illustrating an example of the fiducial mark portion in an EUV mask.

Further, FIG. 10 is a perspective view schematically illustrating the EUV mask 30 in the vicinity of the fiducial mark. As such, in this case, the materials that are exposed at the surface within a specific area, that is centered at the intersection point of the cross corresponds to the fiducial mark, and is large enough for having the fiducial mark recognized, are made of two kinds of materials including the reflective layer 12 and the protection layer 13. Thus, when forming the EUV mask 30, the fiducial position can be easily specified because detection noise of the fiducial position perimeter can be reduced in a method of detecting the fiducial mark by scanning with the EUV light, the ultraviolet light, the electron beam or the like, or in a method of detecting the fiducial mark by image recognition, for example.

In the above embodiment, an example is explained in which the concave fiducial mark 16 is formed in the EUV mask blank 10 by removing a part of the reflective layer 12 from the surface of the protection layer 13 to penetrate the protection layer 13, and the exposed area 24 is set by positive resist to obtain the EUV mask 30 with the fiducial mark. However, this is not limited so. For example, a concave fiducial mark may be formed on a surface other than the surface of the protection layer 13; a convex fiducial mark may be formed; or concave and convex surfaces of the fiducial mark when the EUV mask is manufactured may be different in accordance with the kind of the resist, in other words, the selection of the positive resist or the negative resist with respect to the surface to form the fiducial mark or the shape of the fiducial mark.

Table 1 is an example of a list indicating positions of a surface of a portion (cruciform) at which the fiducial mark and the exposed area are overlapped, and a surface of a portion of the exposed area (other than the cruciform) at which the fiducial mark is not overlapped for four categories divided by the combination of the shape of the fiducial mark (the concave shape or the convex shape) and the kind of the resist (the positive resist or the negative resist). Here, when the surface of the "cruciform" and the surface of the "other than the cruciform" are the material, the heights are different in the EUV mask, and the fiducial mark can be recognized by a step generated at the interface thereof.

TABLE 1

| FIDUCIAL MARK: CONCAVE/RESIST: POSITIVE/WITH PROTECTIVE LAYER | | | | |
| --- | --- | --- | --- | --- |
| FORMED POSITION | SUBSTRATE | REFLECTIVE LAYER | PROTECTION LAYER | PROTECTION LAYER + REFLECTIVE LAYER |
| CRUCIFORM | PROTECTION LAYER | PROTECTION LAYER | PROTECTION LAYER | REFLECTIVE LAYER |
| OTHER THAN CRUCIFORM | PROTECTION LAYER | PROTECTION LAYER | PROTECTION LAYER | PROTECTION LAYER |

| FIDUCIAL MARK: CONCAVE/RESIST: NEGATIVE/WITH PROTECTIVE LAYER | | | | | | |
| --- | --- | --- | --- | --- | --- | --- |
| FORMED POSITION LOW REFLECTIVE LAYER | SUBSTRATE | | REFLECTIVE LAYER | | PROTECTION LAYER | |
| | WITH | WITHOUT | WITH | WITHOUT | WITH | WITHOUT |
| CRUCIFORM | LOW REFLECTIVE LAYER | ABSORBER LAYER | LOW REFLECTIVE LAYER | ABSORBER LAYER | LOW REFLECTIVE LAYER | ABSORBER LAYER |
| OTHER THAN CRUCIFORM | LOW REFLECTIVE LAYER | ABSORBER LAYER | LOW REFLECTIVE LAYER | ABSORBER LAYER | LOW REFLECTIVE LAYER | ABSORBER LAYER |

| FIDUCIAL MARK: CONCAVE/RESIST: NEGATIVE/WITH PROTECTIVE LAYER | | | |
| --- | --- | --- | --- |
| FORMED POSITION LOW REFLECTIVE LAYER | PROTECTION LAYER + REFLECTIVE LAYER WITH | ABSORBER LAYER WITHOUT | LOW REFLECTIVE LAYER + ABSORBER LAYER WITH |
| CRUCIFORM | ABSORBER LAYER | ABSORBER LAYER | ABSORBER LAYER |
| OTHER THAN CRUCIFORM | ABSORBER LAYER | ABSORBER LAYER | LOW REFLECTIVE LAYER |

TABLE 1-continued

FIDUCIAL MARK: CONVEX (A LAYER = MATERIAL WHOSE ETCHING RATE IS SLOWER THAN ABSORBER LAYER, LOW REFLECTIVE LAYER)/RESIST: POSITIVE/WITH PROTECTIVE LAYER

| FORMED POSITION | SUBSTRATE | REFLECTIVE LAYER | PROTECTION LAYER | ABSORBER LAYER (WITHOUT LOW REFLECTIVE LAYER) | LOW REFLECTIVE LAYER |
|---|---|---|---|---|---|
| CRUCIFORM | PROTECTION LAYER | PROTECTION LAYER | A LAYER | A LAYER | A LAYER |
| OTHER THAN CRUCIFORM | PROTECTION LAYER | PROTECTION LAYER | PROTECTION LAYER | PROTECTION LAYER | PROTECTION LAYER |

FIDUCIAL MARK: CONVEX (A LAYER = MATERIAL WHOSE ETCHING RATE IS SLOWER THAN ABSORBER LAYER, LOW REFLECTIVE LAYER)/RESIST: NEGATIVE/WITH PROTECTIVE LAYER

| FORMED POSITION LOW REFLECTIVE LAYER | SUBSTRATE | | REFLECTIVE LAYER | |
|---|---|---|---|---|
| | WITH | WITHOUT | WITH | WITHOUT |
| CRUCIFORM | LOW REFLECTIVE LAYER | ABSORBER LAYER | LOW REFLECTIVE LAYER | ABSORBER LAYER |
| OTHER THAN CRUCIFORM | LOW REFLECTIVE LAYER | ABSORBER LAYER | LOW REFLECTIVE LAYER | ABSORBER LAYER |

FIDUCIAL MARK: CONVEX (A LAYER = MATERIAL WHOSE ETCHING RATE IS SLOWER THAN ABSORBER LAYER, LOW REFLECTIVE LAYER)/RESIST: NEGATIVE/WITH PROTECTIVE LAYER

| FORMED POSITION LOW REFLECTIVE LAYER | PROTECTION LAYER | | ABSORBER LAYER (WITHOUT LOW REFLECTIVE LAYER) | LOW REFLECTIVE LAYER |
|---|---|---|---|---|
| | WITH | WITHOUT | WITHOUT | WITH |
| CRUCIFORM | LOW REFLECTIVE LAYER | ABSORBER LAYER | ABSORBER LAYER | LOW REFLECTIVE LAYER |
| OTHER THAN CRUCIFORM | LOW REFLECTIVE LAYER | ABSORBER LAYER | ABSORBER LAYER | LOW REFLECTIVE LAYER |

In Table 1, "A layer" means a layer of a convex fiducial mark.

EXAMPLES

Example 1

In Example 1, the EUV mask blank 10 illustrated in FIG. 5B was manufactured. For the substrate 11, a $SiO_2$—$TiO_2$-based glass substrate with an outer shape of 6 inch (152 mm) square and a thickness of 0.25 inch (6.35 mm) was used. For the glass substrate, coefficient of thermal expansion at 20° C. was $0.05 \times 10^{-7}$/° C., Young's modulus was 67 GPa, Poisson ratio was 0.17, and specific rigidity was $3.07 \times 10^7$ m²/s². Further, it was confirmed that the glass substrate was polished, surface roughness of the main surface was less than or equal to 0.15 nm rms and flatness was less than or equal to 100 nm.

Next, a CrN film with a thickness of about 200 nm was deposited on a rear surface of the glass substrate (substrate 11) by magnetron sputtering to obtain a conductive coating layer (not illustrated in FIG. 5B) whose sheet resistance was less than or equal to 100Ω/□. Thereafter, under a status that the conductive coating layer side of the glass substrate was fixed to an electrostatic chuck, the reflective layer 12 composed of a Mo/Si multilayer reflective film was formed at the main surface of the substrate 11 by ion beam sputtering. Specifically, a Si layer with a thickness of 4.5 nm and a Mo layer with a thickness of 2.3 nm were alternately formed by ion beam sputtering for 40 times (40 time cycles). At this time, the thickness of the reflective layer (Mo/Si multilayer reflective film) was 272 nm ((4.5 nm+2.3 nm)×40). Further, the protection layer 13 composed of a Ru layer with a thickness of 2.5 nm was formed on the reflective layer 12 by ion beam sputtering. Here, specific deposition conditions of the reflective layer 12 and the protection layer 13 are as illustrate in Table 2.

TABLE 2

| | REFLECTIVE LAYER | | PROTECTION LAYER |
|---|---|---|---|
| | Si LAYER | Mo LAYER | Ru LAYER |
| TARGET | Si TARGET (BORON DOPED) | Mo TARGET | Ru TARGET |
| SPUTTERING GAS | Ar | Ar | Ar |
| GAS PRESSURE | 0.02 [Pa] | 0.02 [Pa] | 0.02 [Pa] |

TABLE 2-continued

| | REFLECTIVE LAYER | | PROTECTION LAYER |
|---|---|---|---|
| | Si LAYER | Mo LAYER | Ru LAYER |
| VOLTAGE | 700 [V] | 700 [V] | 500 [V] |
| DEPOSITION RATE | 4.62 [nm/min] | 3.84 [nm/min] | 1.38 [nm/min] |
| THICKNESS | 4.5 [nm] | 2.3 [nm] | 2.5 [nm] |

Next, in a plane of the substrate with the reflective layer where the Ru layer is formed at surface, cruciform fiducial marks are formed at an outside area from an area of 132 mm square, that corresponds to the mask pattern area, and at four corners of the substrate with the reflective layer by FIB processing. At this time, the fiducial marks are positioned such that an outer edge of a shape obtained by tying the intersection points of the crosses of the fiducial marks is square in which each side is parallel to each of the edge surfaces of the substrate. At this time, for each of the two lines that form the cruciform in a plan view, a concave groove with a length L of 500 μm, a width W of 1 μm is formed by irradiating focused $Ga^+$ ion beam on the Ru layer surface using a FIB apparatus to be a depth of about 100 nm. With this, the Ru layer at a portion to which the ion beam was irradiated is completely removed and about 14 pairs of the Mo layer/Si layer among the Mo/Si multilayer reflective film at that portion are removed.

Next, a TaN film including Ta and N with a thickness of 60 nm is formed on the protection layer 13 composed of the Ru layer by magnetron sputtering, as the absorber layer 14. Further, a TaON film including Ta, O and N with a thickness of 8 nm is formed on the absorber layer 14 composed of the TaN film by magnetron sputtering, as the low reflective layer 15. Here, specific deposition conditions of the absorber layer 14 and the low reflective layer 15 are shown in Table 3. As such, the EUV mask blank was obtained.

TABLE 3

| | ABSORBER LAYER | LOW REFLECTIVE LAYER |
|---|---|---|
| MATERIAL | TaN | TaON |
| TARGET | Ta TARGET | Ta TARGET |
| SPUTTERING GAS | MIXED GAS OF Ar AND $N_2$ | MIXED GAS OF Ar, $O_2$ AND $N_2$ |
| GAS RATIO | Ar:$N_2$ = 86 vol %:14 vol % | Ar:$O_2$:$N_2$ = 49 vol %:37 vol %:14 vol % |
| GAS PRESSURE | 0.3 [Pa] | 0.3 [Pa] |
| POWER | 150 [W] | 250 [W] |
| DEPOSITION RATE | 7.2 [nm/min] | 2.0 [nm/min] |
| THICKNESS | 60 [nm] | 8 [nm] |

Next, a resist film is formed by supplying positive chemical amplification type resist (manufactured by FUJIFILM Electronic Materials Co., Ltd., product number: PRL009) on the EUV mask blank, the surface of which is covered with TaON, making the uniform thickness of about 150 nm by spin coating and baking the positive chemical amplification type resist. Thereafter, the EUV mask blank with a resist film is fed in an electron beam lithography apparatus (manufactured by NuFlare Technology, Inc., product number: EBM8000), and the variation of the reflectance in the vicinity of each of the fiducial marks is detected by the electron beam along directions (X axis direction, Y axis direction) parallel to edge surfaces of the substrate. The fiducial position corresponding to the intersection point of each of the fiducial marks placed at four corners is specified by the variation of the reflectance. At this time, the width of the electron beam is about 300 nm, and the electron beam scans with a length of about 5 μm while shifting in a direction orthogonal to the scanning direction with a space of about 2 μm. At this time, the amount of the electron beam (exposure density) irradiated on the resist film in scanning is greater than or equal to 30 μC/$cm^2$. Next, the electron beam scans to form a square exposed area about 10 μm square centered at the intersection point of each of the specified fiducial marks. At this time, the amount of the irradiated electron beam (exposure density) is greater than or equal to 30 μC/$cm^2$.

Next, by soaking in the developing agent, the exposed portion of the resist film onto which the electron beam is irradiated is dissolved, removed and washed. At this time, TaON is exposed at the portion where the resist film is removed. Next, the low reflective layer (TaON) and the absorber layer (TaN) are etched by the fluorine-based gas process of the RF plasma etching apparatus. The etching conditions are, bias RF: 50 W, etching period: 120 seconds, trigger pressure: 3 Pa, etching pressure: 0.3 Pa, etching gas: $CF_4$/He, the gas flow rate ($CF_4$/He): 4/16 sccm, and the distance between the electrode and the substrate: 55 mm. At this time, Ru is exposed at the portion other than the fiducial marks where the low reflective layer and the absorber layer are etched.

Thereafter, by soaking in the stripping liquid, the remaining resist is removed. As such, the EUV mask is formed. At this time, a square concave area of about 10 μm square is formed in the vicinity of each of the fiducial marks, and the concave cruciform area is further exposed within the square area. Then, in the square area, a surface of the Mo/Si multilayer reflective film where about 14 pairs of Mo/Si films are removed is exposed at the cruciform portion, and Ru is exposed at the area other than the cruciform portion.

Next, by scanning with the EUV light about 10 μm length in the vicinity of the fiducial mark of the manufactured EUV mask, the reflectance at the Ru surface is about 62% and the reflectance at the surface of the partially removed Mo/Si multilayer reflective film is about 50%, and the fiducial mark can be detected by the difference between the reflectances. Further, in this case, as only two kinds of surfaces, Ru and the multilayer reflective film, are exposed at a square region of about 10 μm square, the intersection point of the fiducial mark can be specified with high detection accuracy.

Comparative Example

In this example, the EUV mask blank with a resist film as illustrated in FIG. 6 is manufactured by the same conditions as Example 1. Next, a step of detecting the fiducial position, a step of developing the resist film, a step of etching the absorber layer and a step of removing the resist film are explained with reference to FIG. 11 to FIG. 15. In particular, in this example, the step of exposing the fiducial mark center area of Example 1 is not performed.

Figure 11:
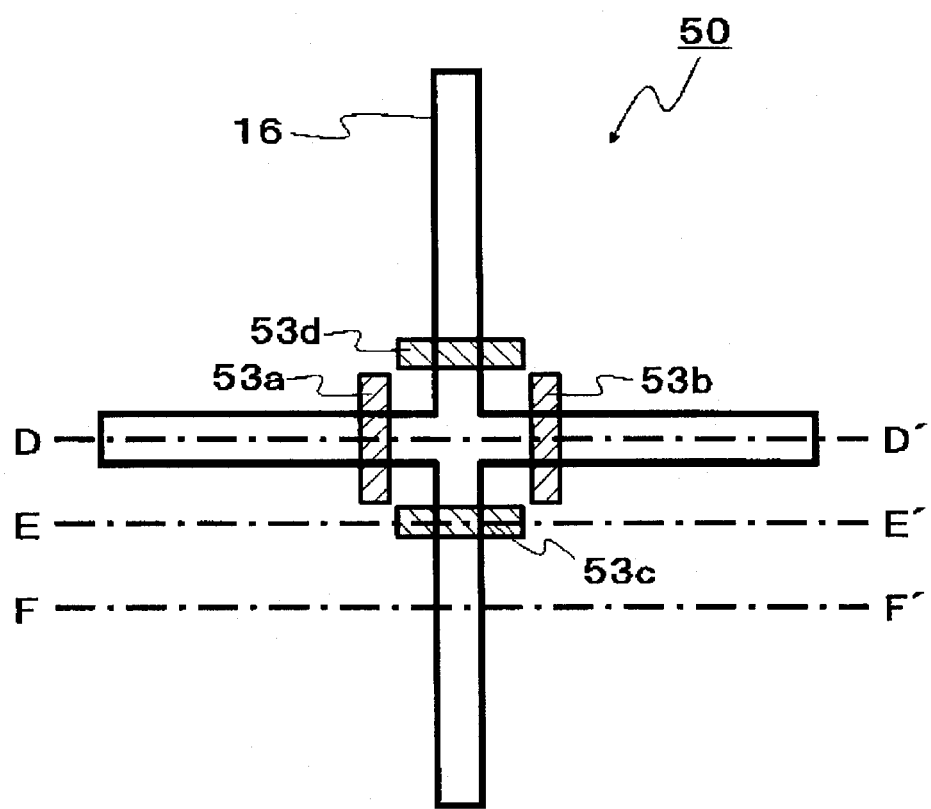
FIG. 11 is a plan view schematically illustrating an example of a fiducial mark portion of an EUV mask blank with a resist film for explaining a comparative example.

FIG. 11 is a plan view schematically illustrating the fiducial mark 16 of an EUV mask blank 50 with a resist film that is manufactured by the same method as Example 1. FIG. 11 further illustrates a part of scan traces 53a, 53b, 53c and 53d formed on the resist film when the EUV mask blank 50 with a resist film is fed in an electron beam lithography apparatus (manufactured by NuFlare Technology, Inc., product number: EBM8000), and the variation of the reflectance was detected by scanning with the electron beam in the vicinity of the fiducial mark along directions parallel to edge surfaces (X axis direction, Y axis direction) of the substrate. At this time, the electron beam whose length is about 2 µm and whose width is about 300 nm performs scanning while shifting with a space about 2 µm in X axis direction and in Y axis direction. As a result, the scan traces 53a, 53b, 53c and 53d are respectively formed at positions that is apart from the intersection point (center) of the fiducial mark for about 1 µm. Further, FIG. 11 illustrates only the typical scan traces that are closest to the intersection point. Here, at this time, the energy of the electron beam (exposure density) is greater than or equal to 30 µC/cm$^2$.

Figure 12A:
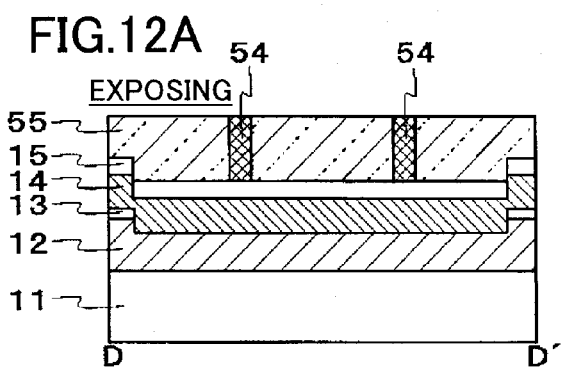
FIG. 12A is a cross-sectional view schematically illustrating the comparative example of the fiducial mark portion after being exposed.

Further, FIG. 12A to FIG. 12D are cross-sectional views schematically illustrating the structure taken along a D-D' line of FIG. 11, FIG. 13A to FIG. 13D are cross-sectional views schematically illustrating the structure taken along an E-E' line of FIG. 11, and FIG. 14A to FIG. 14D are cross-sectional views schematically illustrating the structure taken along an F-F' line of FIG. 11. FIG. 12A, FIG. 13A and FIG. 14A are cross-sectional views schematically illustrating a status after the step of detecting the fiducial position in which a portion corresponding to the scan trace formed by the electron beam becomes an exposed portion 54 of the chemical amplification type resist film. On the other hand, the portion to which the electron beam is not irradiated is a non-exposed portion 55.

Figure 12C:
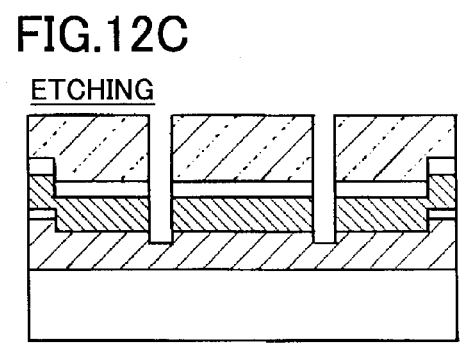
FIG. 12C is a cross-sectional view schematically illustrating the comparative example of the fiducial mark portion after being etched.
Figure 12B:
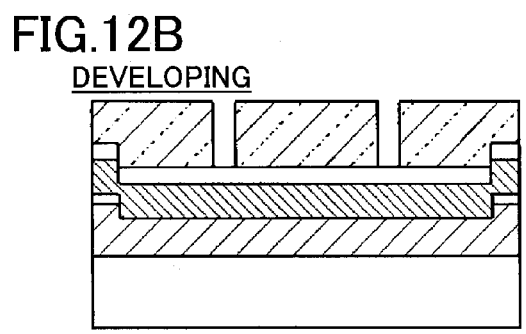
FIG. 12B is a cross-sectional view schematically illustrating the comparative example of the fiducial mark portion after being developed.

Next, similar to Example 1, the resist film corresponding to the exposed portion 54 is dissolved and removed by the developing agent. FIG. 12B, FIG. 13B and FIG. 14B are cross-sectional views schematically illustrating a status after the developing step in which a surface of TaON (low reflective layer) is exposed at a portion where the exposed portion 54 is removed. Next, by the same conditions as Example 1, TaON (low reflective layer) and TaN (absorber layer) are etched. FIG. 12C, FIG. 13C and FIG. 14C are cross-sectional views schematically illustrating a status after the etching step in which the Mo/Si multilayer reflective film is exposed at a portion where TaON and TaN are removed.

Figure 12D:
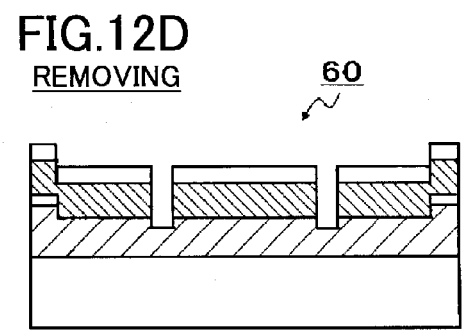
FIG. 12D is a cross-sectional view schematically illustrating the comparative example of the fiducial mark portion after being removed.
Figure 15:
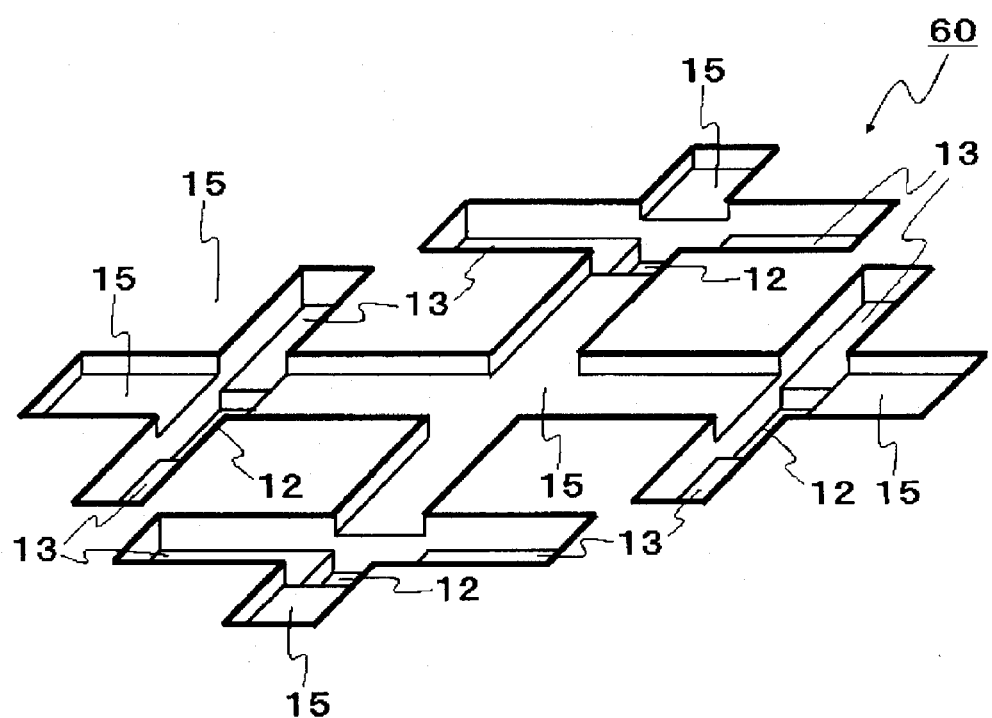
FIG. 15 is a perspective view schematically illustrating a comparative example of a fiducial mark portion of an EUV mask.
Figure 16:
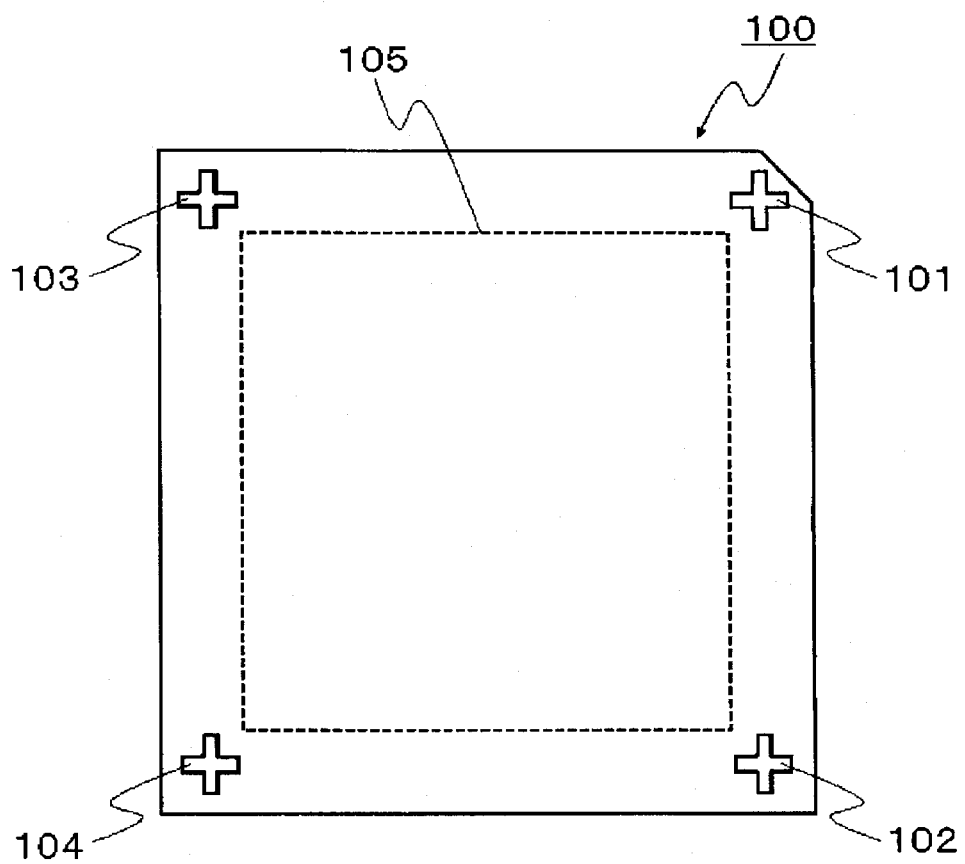
FIG. 16 is a plan view schematically illustrating a positional relationship between the EUV mask blank and the fiducial marks.

Next, similar to Example 1, the remaining resist film (non-exposed portion 55) is removed by stripping liquid. FIG. 12D, FIG. 13D and FIG. 14D are cross-sectional views schematically illustrating a status after the removing step and this structure corresponds to the EUV mask 60 of the example. Further, FIG. 15 is a perspective view schematically illustrating the EUV mask 60 of the embodiment in the vicinity of the fiducial mark. As such, at a square plane area about 10 µm square centered at the intersection point of the cross corresponding to the fiducial mark, grooves are formed at positions corresponding to the scan traces 53a, 53b, 53c and 53d, and further, deeper grooves are formed at portions where the scan traces and the fiducial mark are overlapped. Here, the bottom surface of the former groove is the Ru layer surface and the bottom surface of the latter groove is the Mo/Si multilayer reflective film. Further, at a portion other than the scan traces 53a, 53b, 53c and 53d, the fiducial mark is formed by TaON.

Here, at a specific area that is large enough for recognizing the fiducial mark, the materials exposed at a surface at this time, include TaON with a step in addition to the Mo/Si multilayer reflective film and the Ru film. Thus, areas that have different reflectances for the EUV light are increased, and noise in detecting the fiducial marks by the electron beam or the image recognition is increased due to the complex structure. Therefore, there is a possibility that the fiducial position cannot be detected with high accuracy when forming an EUV mask 60.

According to the embodiment, a reflective mask blank for EUV lithography with a resist film, a method of manufacturing thereof, a reflective mask for EUV lithography and a method of manufacturing thereof capable of increasing detection sensitivity of a fiducial mark that indicates a fiducial position for specifying a position of a defect existing in a mask pattern area in inspecting a mask pattern of the reflective mask for EUV lithography are provided.

Although a preferred embodiment of the reflective mask blank for EUV lithography, the method of manufacturing thereof, the reflective mask for EUV lithography and the method of manufacturing thereof has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A method of manufacturing a reflective mask blank for EUV lithography with a resist film, comprising:
   preparing a reflective mask blank for EUV lithography including a substrate, a reflective layer that reflects an EUV light on the substrate, and an absorber layer that absorbs the EUV light on the reflective layer,
   the reflective mask blank for EUV lithography being provided with three or more concave or convex fiducial marks being formed at an outside area from a mask pattern area of the reflective mask blank for EUV lithography,
   each of the fiducial marks being formed by at least two lines in a plan view,
   each of the lines that form the fiducial mark being placed to extend along any one of a plurality of virtual lines that cross at an intersection point, and
   at least one of the lines of the fiducial mark being placed to extend along each of the virtual lines;
   forming a resist film on the reflective mask blank for EUV lithography including the fiducial marks;
   detecting fiducial positions corresponding to the intersection points of the fiducial marks by scanning the resist film with an electron beam or an ultraviolet light above the resist film; and
   exposing specific areas of the resist film including circular areas centered at the fiducial positions of the respective fiducial marks with a radius of 1.5W in a plan view, where W is the maximum value of a width of the line of the respective fiducial marks, by using the electron beam or the ultraviolet light.

2. The method of manufacturing the reflective mask blank for EUV lithography with a resist film according to claim 1, wherein each of the lines that form the fiducial marks is placed to extend along either of two straight virtual lines that are orthogonal with each other, at least one of the lines of the fiducial mark being placed to extend along each of the virtual lines.

3. The method of manufacturing the reflective mask blank for EUV lithography with a resist film according to claim 1, wherein an amount of exposure per unit area of the area irradiated by the electron beam is greater than or equal to 3 µC/cm².

4. The method of manufacturing the reflective mask blank for EUV lithography with a resist film according to claim 1, wherein an amount of exposure per unit area of the area irradiated by the ultraviolet light is greater than or equal to 5 mJ/cm².

5. The method of manufacturing the reflective mask blank for EUV lithography with a resist film according to claim 1, wherein in the exposing, the electron beam or the ultraviolet light exposes the specific areas by scanning the specific areas with the focused electron beam or the ultraviolet light.

6. The method of manufacturing the reflective mask blank for EUV lithography with a resist film according to claim 1, wherein in the exposing, the electron beam or the ultraviolet light exposes the specific areas by a one-shot exposure using the electron beam or the ultraviolet light.

7. The method of manufacturing the reflective mask blank for EUV lithography with a resist film according to claim 1, wherein each of the fiducial marks is formed as a concave portion by removing a part of the reflective layer.

8. The method of manufacturing the reflective mask blank for EUV lithography with a resist film according to claim 1, wherein four of the fiducial marks are formed at four corners of the reflective mask blank for EUV lithography in a plan view, respectively, and at least one of the fiducial marks is formed to have a shape different from that of the other fiducial marks.

9. The reflective mask blank for EUV lithography with a resist film according to claim 1,
wherein the resist film is a positive resist.

10. A method of manufacturing a reflective mask for EUV lithography, comprising:
preparing a reflective mask blank for EUV lithography including a substrate, a reflective layer that reflects an EUV light on the substrate, and an absorber layer that absorbs the EUV light on the reflective layer,
the reflective mask blank for EUV lithography being provided with three or more concave or convex fiducial marks being formed at an outside area from a mask pattern area of the reflective mask blank for EUV lithography,
each of the fiducial marks being formed by at least two lines in a plan view,
each of the lines that form the fiducial mark being placed to extend along any one of a plurality of virtual lines that cross at an intersection point, and
at least one of the lines of the fiducial mark being placed to extend along each of the virtual lines;
forming a resist film on the reflective mask blank for EUV lithography including the fiducial marks;
detecting fiducial positions corresponding to the intersection points of the fiducial marks by scanning the resist film with an electron beam or an ultraviolet light above the resist film;
exposing specific areas of the resist film including circular areas centered at the fiducial positions of the respective fiducial marks with a radius of 1.5W in a plan view, where W is the maximum value of a width of the line of the respective fiducial marks, by using the electron beam or the ultraviolet light;
developing the resist film;
etching the absorber layer using the resist film as a mask; and
removing the remaining resist film.

11. A reflective mask blank for EUV lithography with a resist film, comprising:
a reflective mask blank for EUV lithography including a substrate, a reflective layer that reflects an EUV light on the substrate, and an absorber layer that absorbs the EUV light on the reflective layer,
the reflective mask blank for EUV lithography being provided with three or more concave or convex fiducial marks, for specifying position of a defect in a mask pattern area, being formed at an outside area from a mask pattern area of the reflective mask blank for EUV lithography,
each of the fiducial marks being formed by at least two lines in a plan view,
each of the lines that form each of the fiducial marks being placed to extend along either of a plurality of virtual lines that cross at an intersection point, and
at least one of the lines of the fiducial mark being placed to extend along each of the virtual lines; and
a resist film on the reflective mask blank for EUV lithography provided with exposed portions that are specific areas including circular areas centered at the fiducial positions of the respective fiducial marks with a radius of 1.5W in a plan view, where W is the maximum value of a width of the line of the respective fiducial marks.

12. The reflective mask blank for EUV lithography with a resist film according to claim 11,
wherein each of the lines that form the fiducial marks is placed to extend along either of two straight virtual lines that are orthogonal with each other, at least one of the lines of the fiducial mark being placed to extend along each of the virtual lines.

13. The reflective mask blank for EUV lithography with a resist film according to claim 11, further comprising a protection layer between the reflective layer and the absorber layer that protects the reflective layer when forming a pattern on the absorber layer.

14. The reflective mask blank for EUV lithography with a resist film according to claim 11,
wherein the fiducial mark has a concave shape and is formed by transferring a groove that is formed in the reflective layer.

15. The reflective mask blank for EUV lithography with a resist film according to claim 11,
wherein four of the fiducial marks are formed at four corners of the reflective mask blank for EUV lithography in a plan view, respectively, and at least one of the fiducial marks is formed to have a shape different from that of the other fiducial marks.

16. The reflective mask blank for EUV lithography with a resist film according to claim 11,
wherein the resist film is a positive resist.

17. A reflective mask for EUV lithography, comprising:
a substrate;
a reflective layer that reflects an EUV light on the substrate;
an absorber layer that absorbs the EUV light on the reflective layer; and
a protection layer between the reflective layer and the absorber layer that protects the reflective layer when forming a pattern to the absorber layer,
the reflective mask for EUV lithography being provided with three or more concave or convex fiducial marks, for specifying position of a defect in a mask pattern area, being formed at an outside area from a mask pattern area of the reflective mask blank for EUV lithography, each of the fiducial marks being formed by at least two lines in a plan view, each of the lines that form each of the fiducial marks being placed to extend along either of a plurality of virtual lines that cross at an intersection point, and at least one of the lines of the fiducial mark being placed to extend along each of the virtual lines, and within circular areas centered at the fiducial positions of the respective fiducial marks with a radius of 1.5W in a plan view, where W is the maximum value of a width of the line of the respective fiducial marks, the reflective layer being exposed at a surface at concave shapes that correspond to the fiducial marks and the protection layer being exposed at a surface other than the fiducial marks.

18. The reflective mask for EUV lithography according to claim 17, wherein each of the lines that form the fiducial marks is placed to extend along either of two straight virtual lines that are orthogonal with each other, at least one of the lines of the fiducial mark being placed to extend along each of the virtual lines.

19. The reflective mask for EUV lithography according to claim 17, wherein four of the fiducial marks are formed at four corners of the reflective mask blank for EUV lithography in a plan view, respectively, and at least one of the fiducial marks is formed to have a shape different from that of the other fiducial marks.

20. The reflective mask for EUV lithography according to claim 17, wherein the protection layer is Ru or a Ru compound.

\* \* \* \* \*